United States Patent
Choi et al.

(10) Patent No.: US 9,378,983 B2
(45) Date of Patent: *Jun. 28, 2016

(54) SEMICONDUCTOR DEVICE AND METHOD OF MOUNTING COVER TO SEMICONDUCTOR DIE AND INTERPOSER WITH ADHESIVE MATERIAL

(71) Applicant: STATS ChipPAC, Ltd., Singapore (SG)

(72) Inventors: DaeSik Choi, Seoul (KR); Sang Mi Park, Kyounggi-do (KR); KyungHoon Lee, Kyunggi-Do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 36 days.

This patent is subject to a terminal disclaimer.

(21) Appl. No.: 13/871,157

(22) Filed: Apr. 26, 2013

(65) Prior Publication Data

US 2013/0241039 A1    Sep. 19, 2013

Related U.S. Application Data

(63) Continuation of application No. 13/100,235, filed on May 3, 2011, now Pat. No. 8,476,115.

(51) Int. Cl.
*H01L 21/56* (2006.01)
*H01L 21/50* (2006.01)
(Continued)

(52) U.S. Cl.
CPC ............ *H01L 21/56* (2013.01); *H01L 21/50* (2013.01); *H01L 23/10* (2013.01); *H01L 23/34* (2013.01); *H01L 23/36* (2013.01); *H01L 23/49827* (2013.01); *H01L 23/552* (2013.01); *H01L 24/83* (2013.01); *H01L 24/92* (2013.01); *H01L 24/16* (2013.01); *H01L 24/29* (2013.01); *H01L 24/32* (2013.01); *H01L 24/73* (2013.01); *H01L 24/81* (2013.01); *H01L 2224/16225* (2013.01); *H01L 2224/16235* (2013.01); *H01L 2224/293* (2013.01); *H01L 2224/2919* (2013.01); *H01L 2224/2929* (2013.01); *H01L 2224/32225* (2013.01); *H01L 2224/32245* (2013.01);
(Continued)

(58) Field of Classification Search
CPC .......... H01L 21/56; H01L 21/50; H01L 23/34
USPC .......... 257/659, 690, 419, 706; 438/127, 122
See application file for complete search history.

(56) References Cited

U.S. PATENT DOCUMENTS 5,136,365 A   8/1992  Pennisi et al.
5,789,278 A   8/1998  Akram et al.
(Continued)

*Primary Examiner* — Sheng Zhu
(74) *Attorney, Agent, or Firm* — Robert D. Atkins; Patent Law Group: Atkins and Associates, P.C.

(57) ABSTRACT

A semiconductor device has an interposer with a die attach area interior to the interposer and cover attach area outside the die attach area. A channel is formed into a surface of the interposer within the cover attach area. A dam material is formed over the surface of the interposer within the cover attach area between the channel and edge of the interposer. A semiconductor die is mounted to the die attach area of the interposer. An adhesive material is deposited in the cover attach area away from the channel and dam material. A cover, such as a heat spreader or shielding layer, is mounted to the die and interposer within the cover attach area. The cover presses the adhesive material into the channel and against the dam material to control outward flow of the adhesive material. Alternatively, ACF can be formed over the interposer to mount the cover.

30 Claims, 24 Drawing Sheets

(51) Int. Cl.
  H01L 23/34 (2006.01)
  H01L 23/552 (2006.01)
  H01L 23/10 (2006.01)
  H01L 23/36 (2006.01)
  H01L 23/498 (2006.01)
  H01L 23/00 (2006.01)

(52) U.S. Cl.
  CPC ............ *H01L2224/33181* (2013.01); *H01L 2224/48091* (2013.01); *H01L 2224/73204* (2013.01); *H01L 2224/73253* (2013.01); *H01L 2224/73265* (2013.01); *H01L 2224/81191* (2013.01); *H01L 2224/81815* (2013.01); *H01L 2224/8385* (2013.01); *H01L 2224/83102* (2013.01); *H01L 2224/83192* (2013.01); *H01L 2224/83203* (2013.01); *H01L 2224/83851* (2013.01); *H01L 2224/83862* (2013.01); *H01L 2224/92225* (2013.01); *H01L 2924/01029* (2013.01); *H01L 2924/01322* (2013.01); *H01L 2924/07811* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/3011* (2013.01); *H01L 2924/3025* (2013.01)

(56) References Cited

U.S. PATENT DOCUMENTS

| | | | |
|---|---|---|---|
| 5,852,320 A * | 12/1998 | Ichihashi | 257/419 |
| 5,889,323 A * | 3/1999 | Tachibana | 257/704 |
| 5,903,056 A | 5/1999 | Canning et al. | |
| 5,977,626 A | 11/1999 | Wang et al. | |
| 6,002,180 A | 12/1999 | Akram et al. | |
| 6,223,429 B1 | 5/2001 | Kaneda et al. | |
| 6,509,636 B1 | 1/2003 | Tsai et al. | |
| 6,534,859 B1 * | 3/2003 | Shim et al. | 257/706 |
| 6,614,122 B1 | 9/2003 | Dory et al. | |
| 6,706,563 B2 | 3/2004 | Shim et al. | |
| 6,765,801 B1 * | 7/2004 | Glenn et al. | 361/764 |
| 6,791,185 B1 | 9/2004 | Akram et al. | |
| 6,919,630 B2 | 7/2005 | Hsiao | |
| 6,933,602 B1 | 8/2005 | Patel et al. | |
| 6,949,404 B1 | 9/2005 | Fritz et al. | |
| 7,019,081 B2 * | 3/2006 | Datta et al. | 525/240 |
| 7,019,981 B2 * | 3/2006 | Heinemann et al. | 361/737 |
| 7,057,276 B2 | 6/2006 | Lin et al. | |
| 7,078,264 B2 | 7/2006 | Yang | |
| 7,122,911 B2 | 10/2006 | Yang | |
| 7,183,657 B2 | 2/2007 | Furtaw et al. | |
| 7,203,072 B2 * | 4/2007 | Chen et al. | 361/760 |
| 7,759,162 B2 | 7/2010 | Karashima et al. | |
| 7,785,708 B2 | 8/2010 | Tatsuzawa et al. | |
| 7,811,843 B1 * | 10/2010 | Lai | 438/28 |
| 8,044,495 B2 | 10/2011 | Abbott | |
| 2003/0042618 A1 * | 3/2003 | Nose et al. | 257/778 |
| 2004/0173372 A1 * | 9/2004 | Suda | 174/52.4 |
| 2005/0067689 A1 * | 3/2005 | Hedler et al. | 257/706 |
| 2007/0246823 A1 * | 10/2007 | Haga et al. | 257/712 |
| 2008/0017995 A1 | 1/2008 | Karashima et al. | |
| 2008/0157344 A1 | 7/2008 | Chen et al. | |
| 2009/0294928 A1 | 12/2009 | Kim et al. | |
| 2010/0207281 A1 | 8/2010 | Su et al. | |
| 2011/0260338 A1 | 10/2011 | Lee et al. | |
| 2012/0086041 A1 * | 4/2012 | Isogai | 257/99 |
| 2012/0126395 A1 | 5/2012 | Lee et al. | |

* cited by examiner

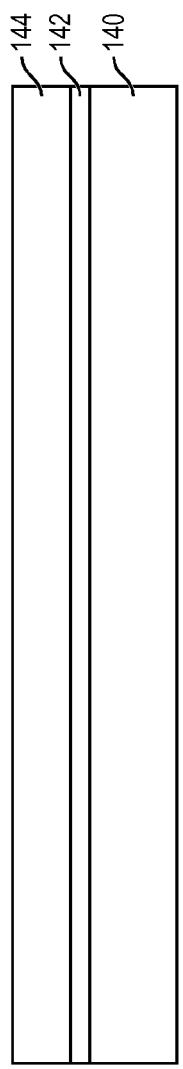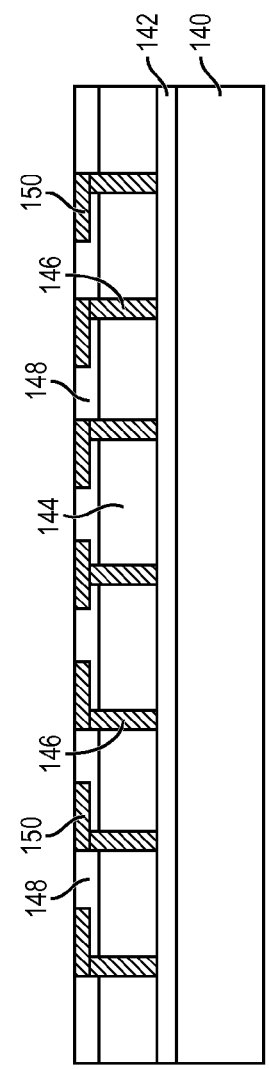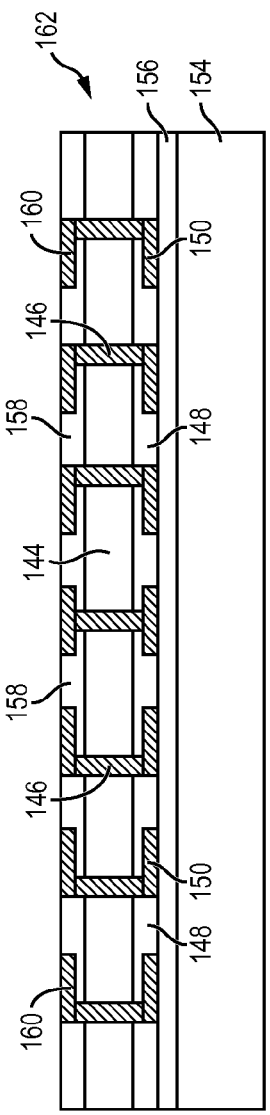

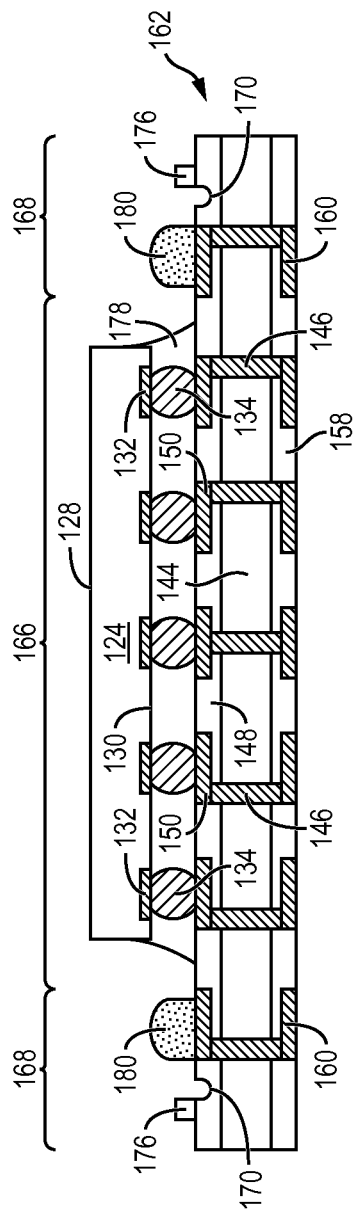
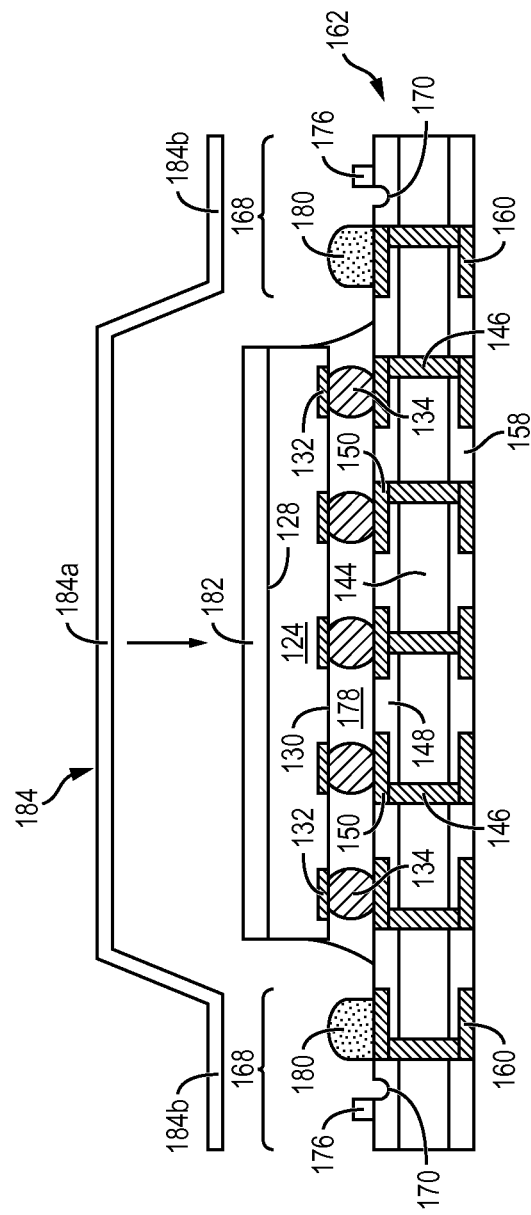

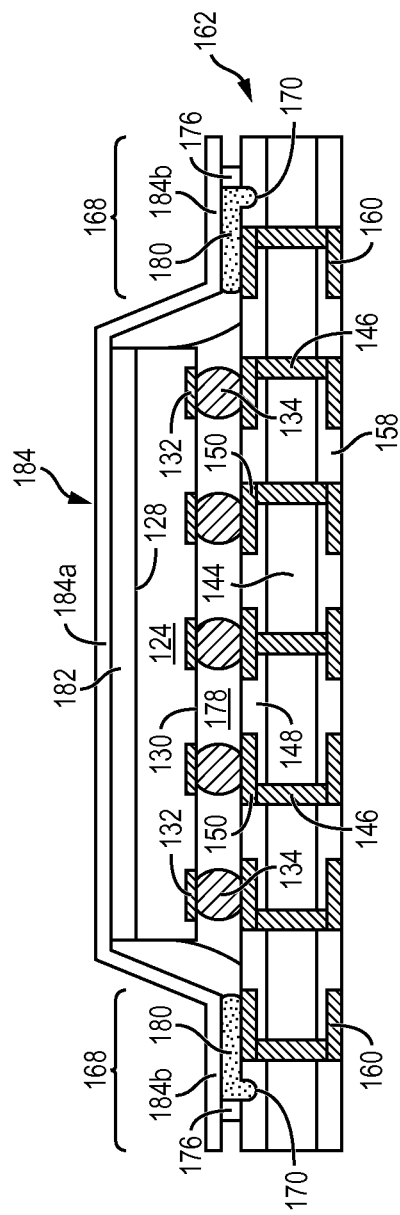
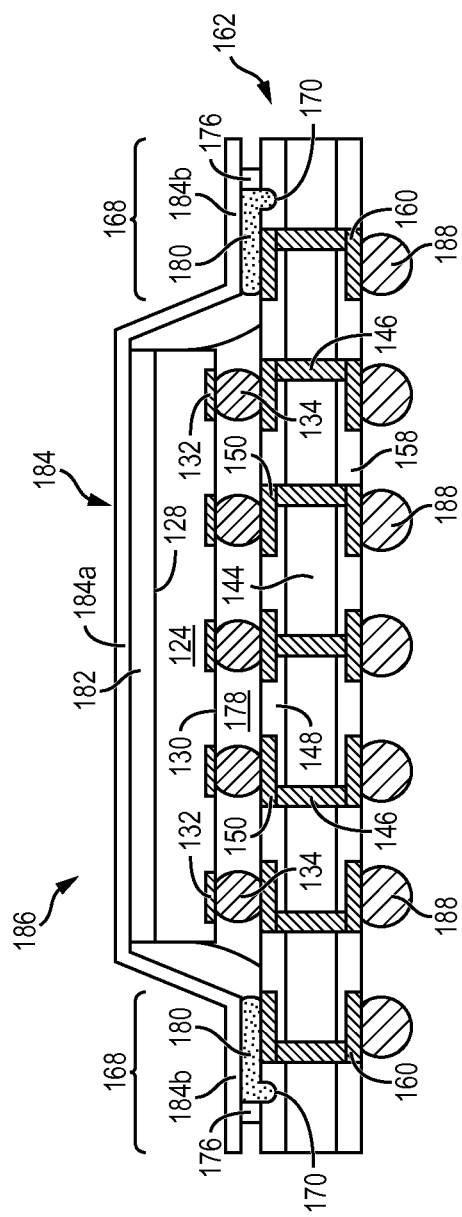

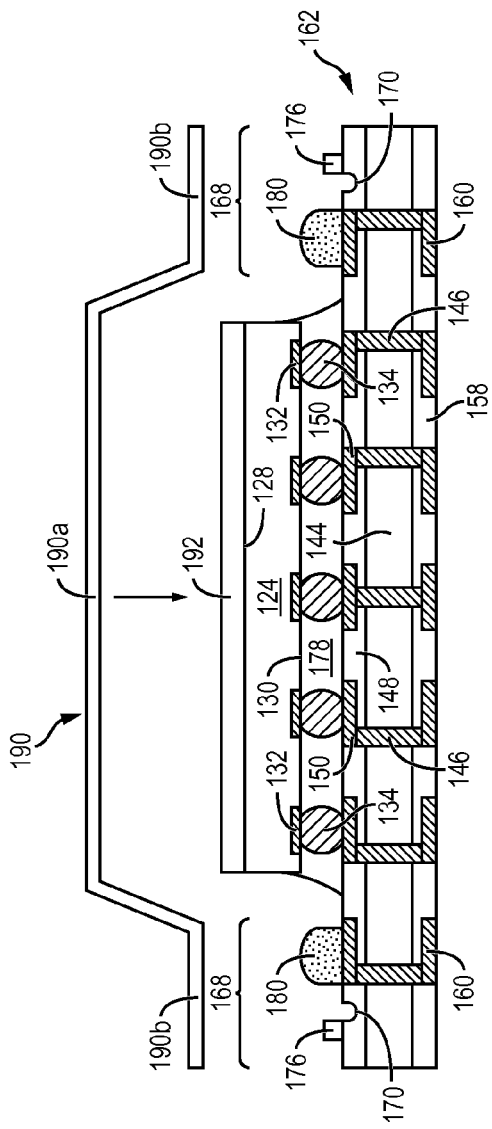
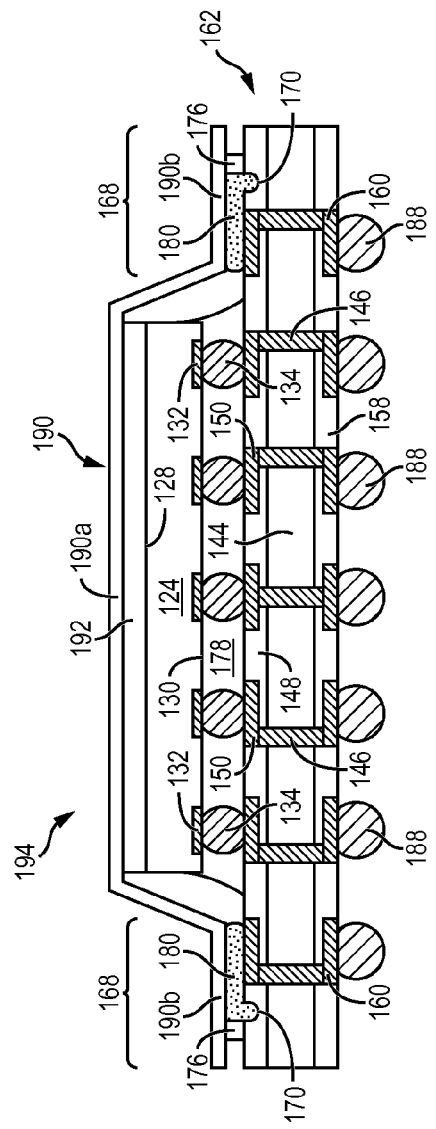
FIG. 5a
FIG. 5b

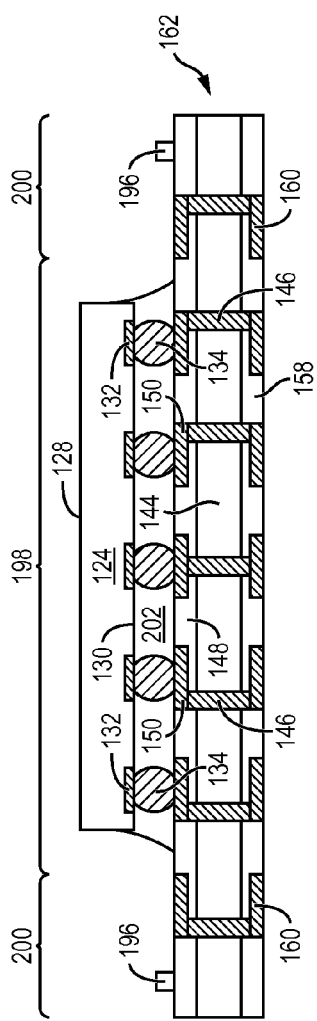
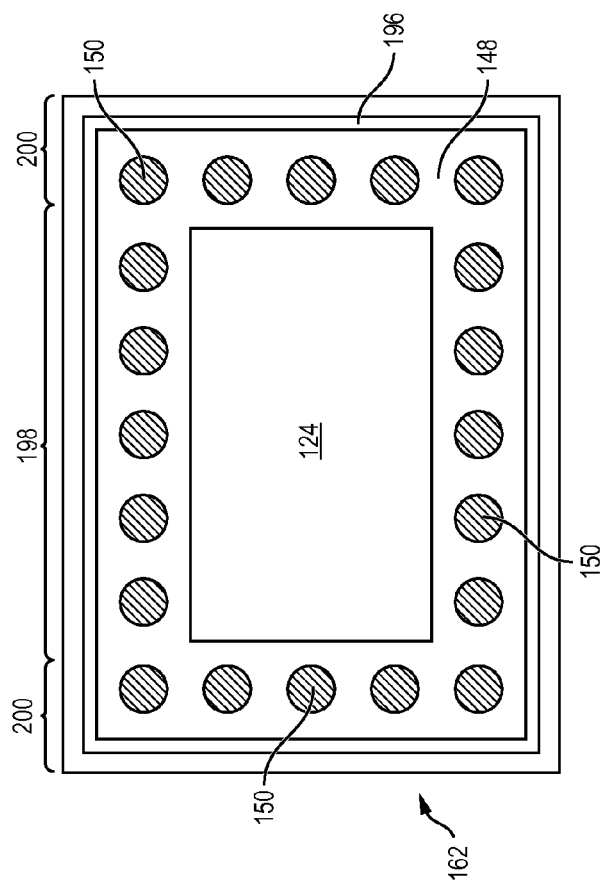
FIG. 6a
FIG. 6b

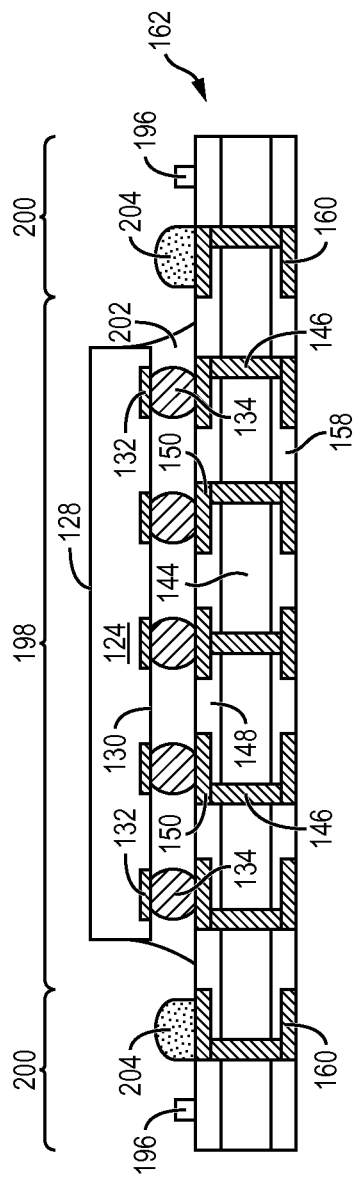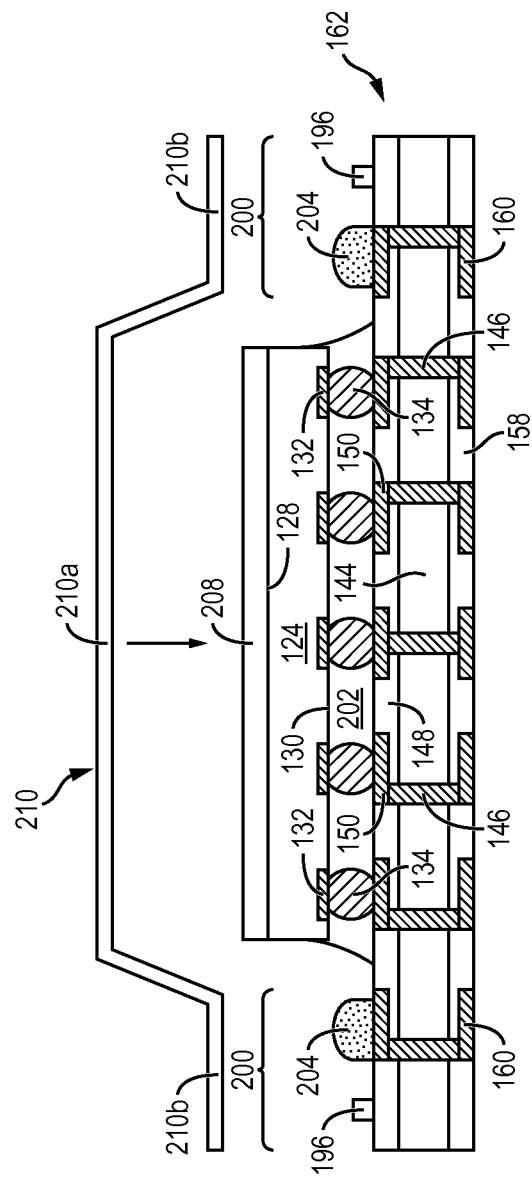

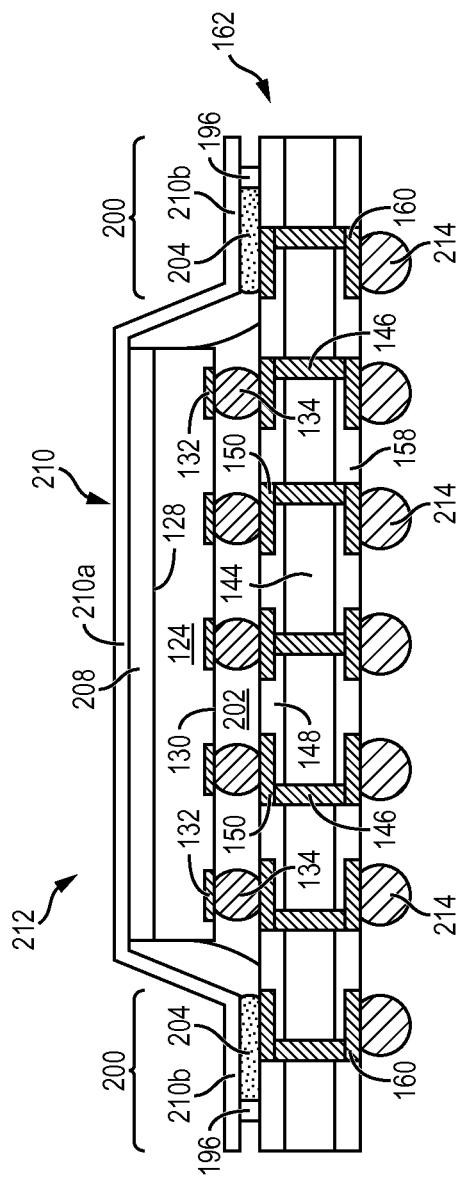
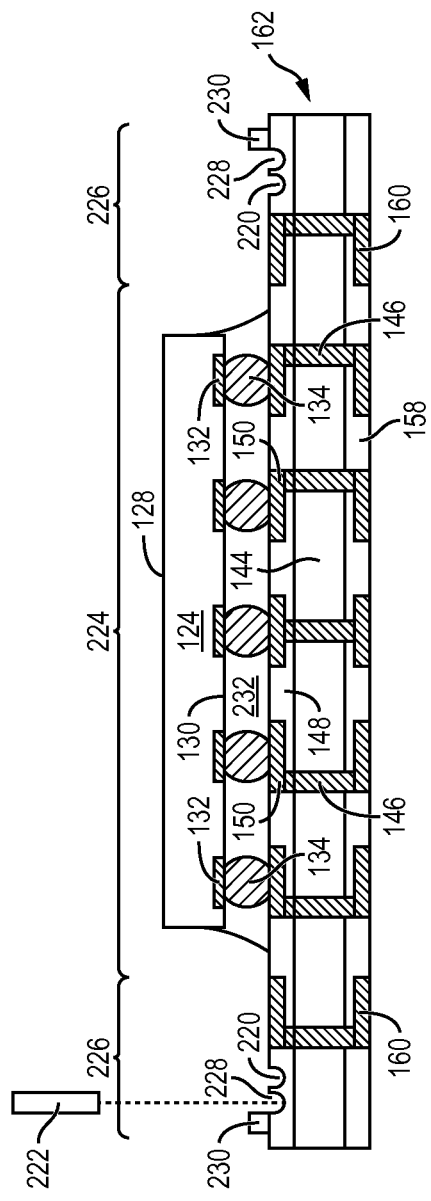
FIG. 6e
FIG. 7a

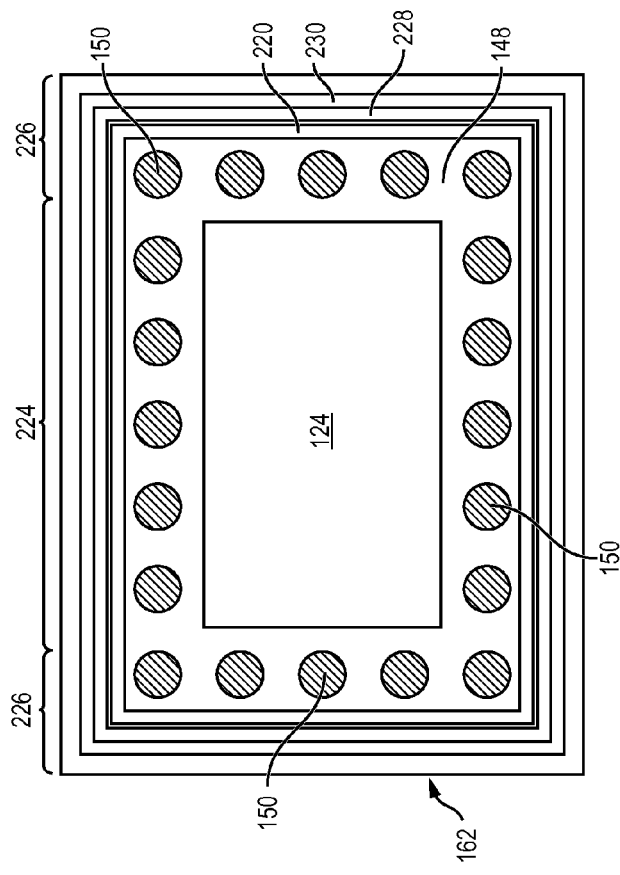
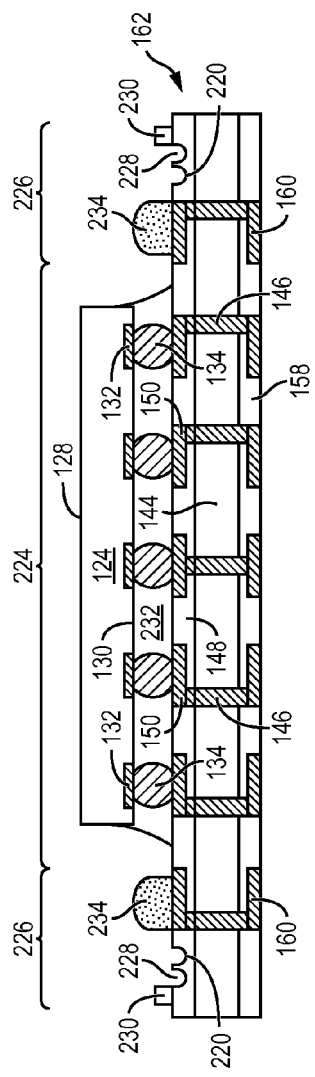
FIG. 7b
FIG. 7c

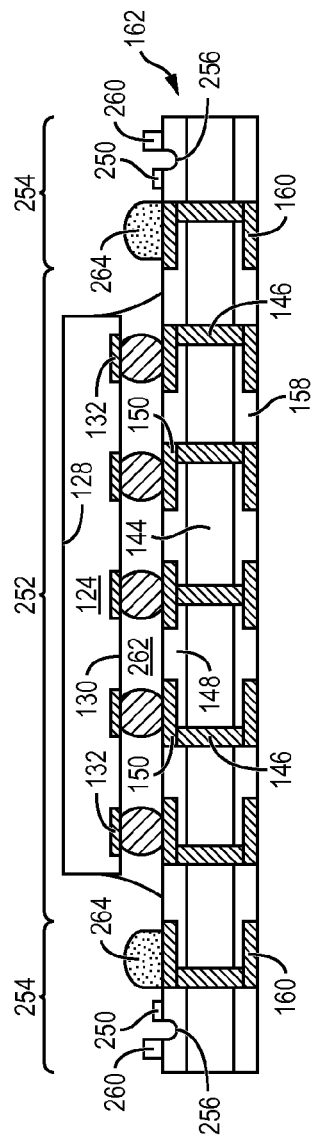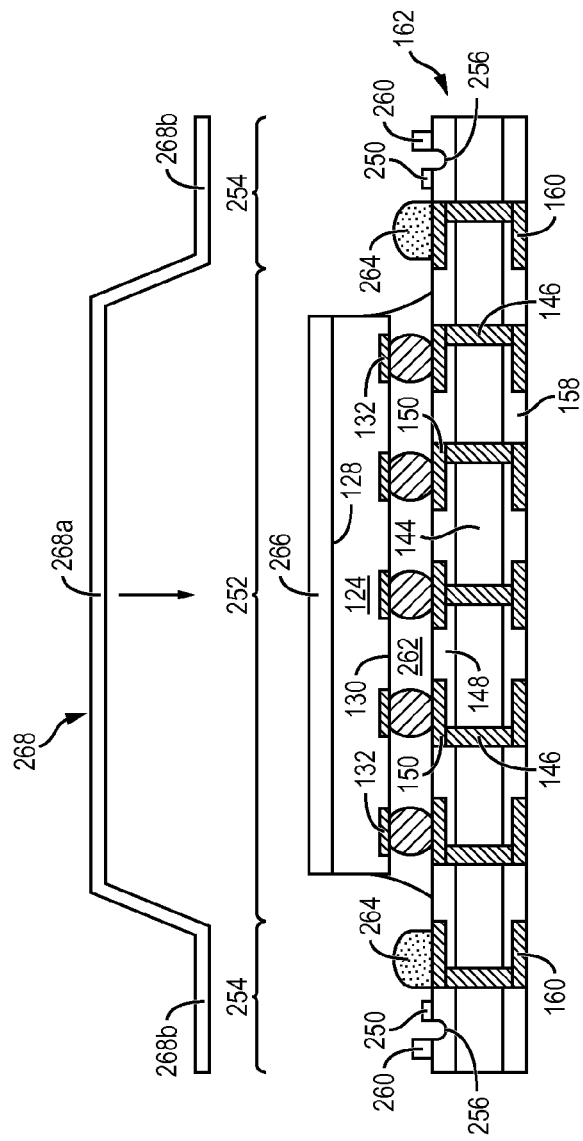

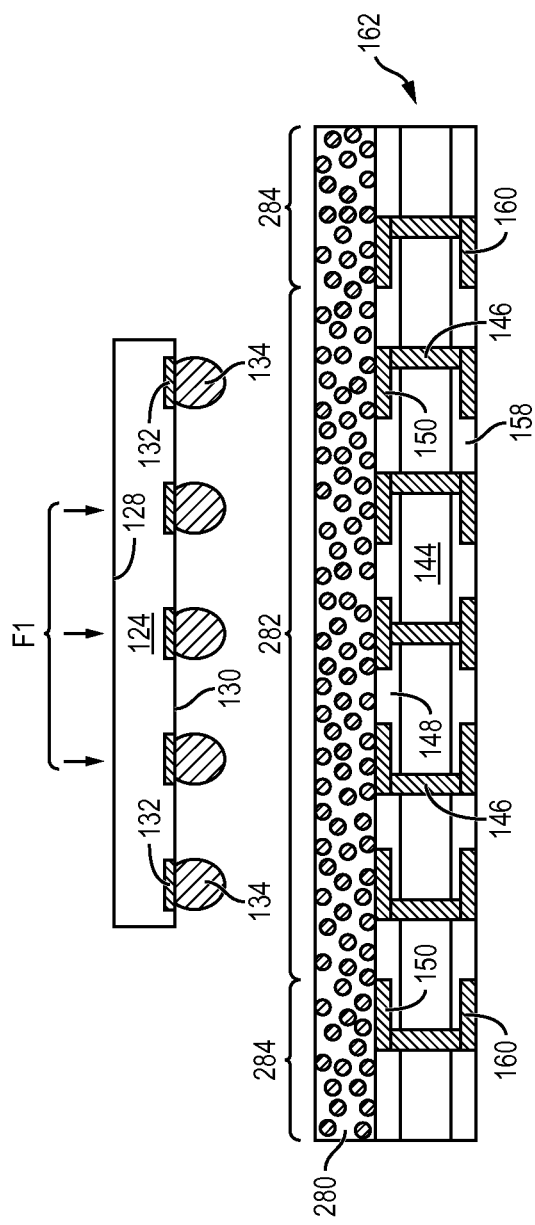
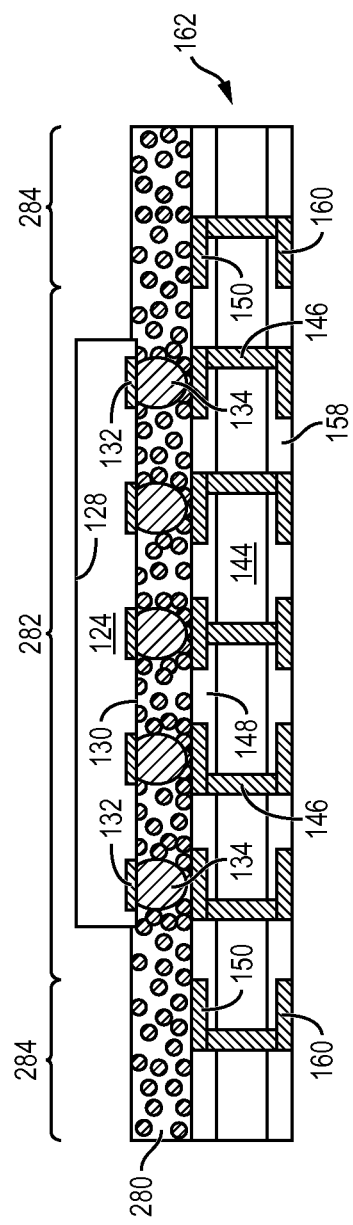

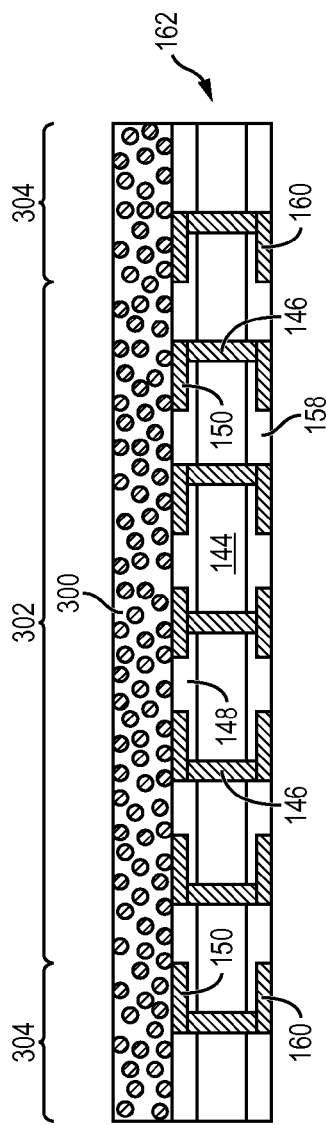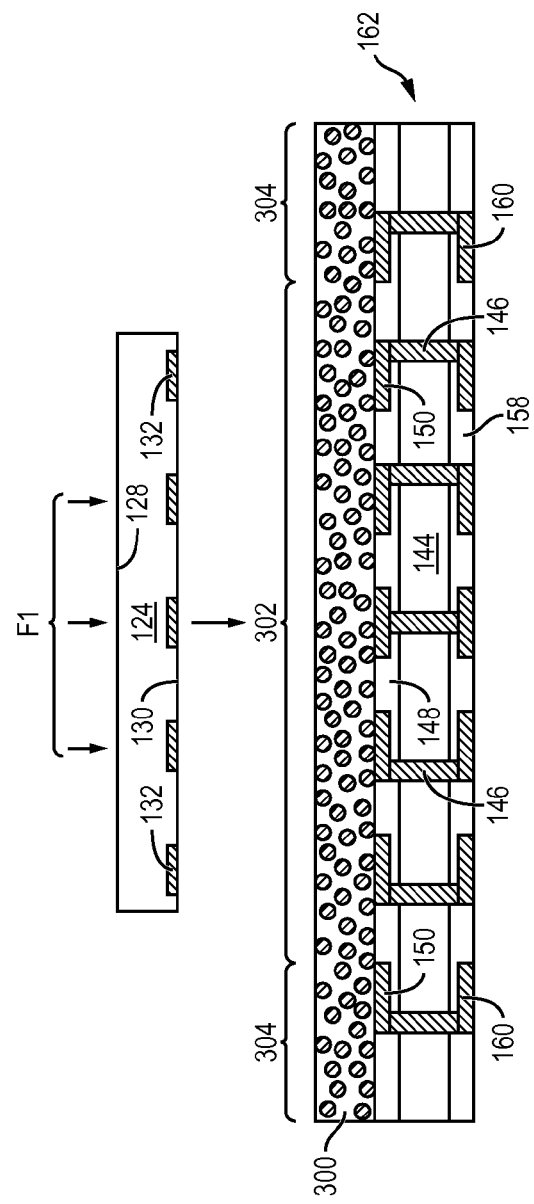

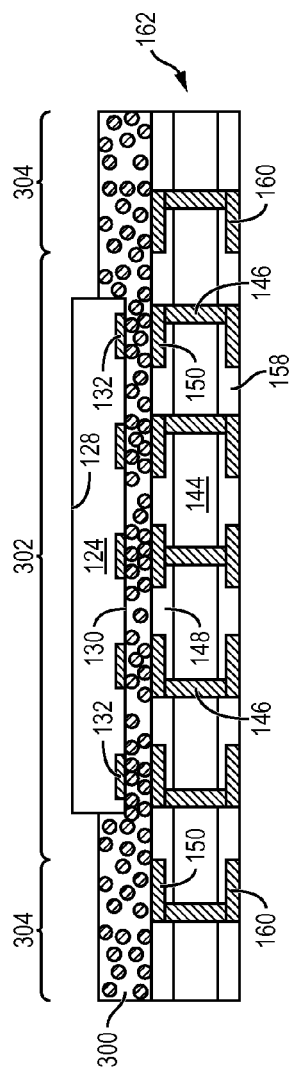
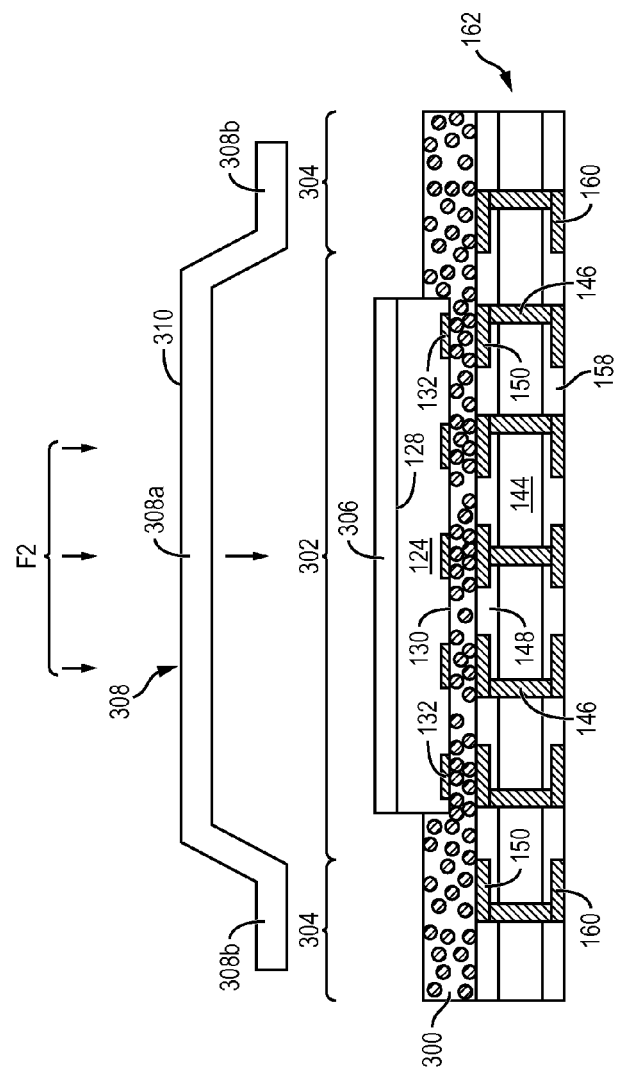

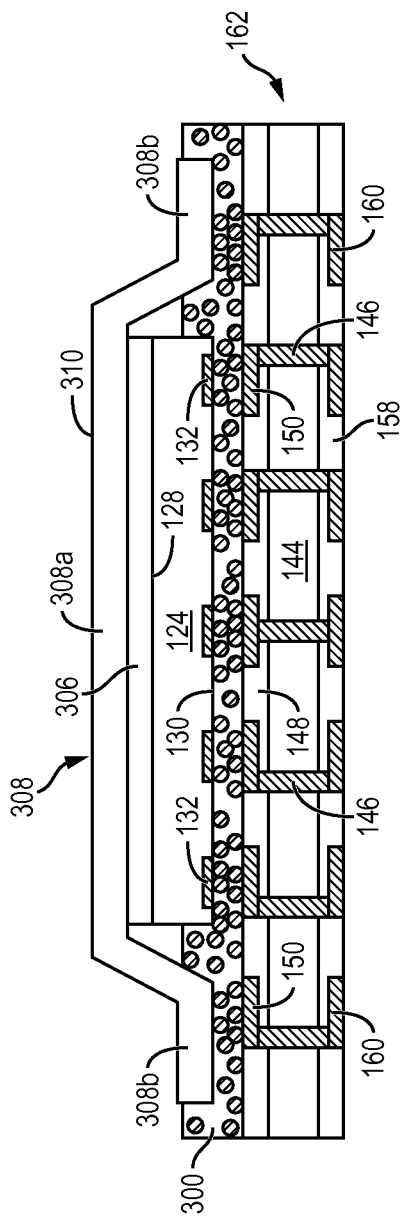
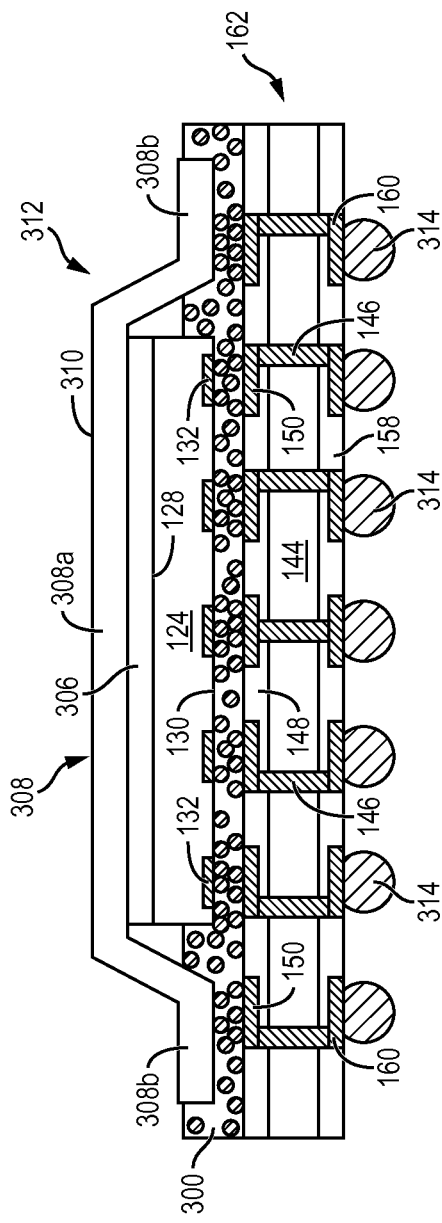

SEMICONDUCTOR DEVICE AND METHOD OF MOUNTING COVER TO SEMICONDUCTOR DIE AND INTERPOSER WITH ADHESIVE MATERIAL

CLAIM TO DOMESTIC PRIORITY

The present application is a continuation of U.S. patent application Ser. No. 13/100,235, now U.S. Patent No. 8,476,115, filed May 3, 2011, which application is incorporated herein by reference.

FIELD OF THE INVENTION

The present invention relates in general to semiconductor devices and, more particularly, to a semiconductor device and method of mounting a cover, such as a heat spreader or shielding layer, to a semiconductor die and interposer with an adhesive material.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays.

Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

To reduce the effects of EMI and RFI, a shielding layer can be placed over the semiconductor die and substrate. The shield layer is typically electrically connected through a build-up interconnect structure to a low impedance ground point to dissipate the EMI and RFI energy. Likewise, a heat spreader or heat sink can be placed over the semiconductor die and substrate to dissipate thermal energy. In each case of covering the semiconductor die, the shielding layer or heat spreader is typically bonded to the semiconductor die and substrate with an adhesive material. However, the shielding layer or heat spreader can become tilted during assembly due to uneven pressure applied to a back surface while mounting, or to uneven or insufficient application of the adhesive material on the semiconductor die and substrate. A tilted cover does not provide the desired EMI and RFI shielding or heat dissipation. If too much adhesive material is deposited on the substrate, then the excess adhesive material bleeds out from the shielding layer or heat spreader. The bleed-out of excess adhesive material can cause interconnect defects and inspection failures. Accordingly, an uneven or improper deposition of adhesive material leads to product defects and increased manufacturing cost.

SUMMARY OF THE INVENTION

A need exists to mount a shielding layer or heat spreader to a semiconductor die and substrate with an adhesive layer without causing cover tilt or bleed-out of excess adhesive material from the cover. Accordingly, in one embodiment, the present invention is a method of making a semiconductor device comprising the steps of providing a substrate, forming a containment structure over a surface of the substrate within a cover attach area of the substrate, providing a cover, depositing an adhesive material over the cover or substrate, and disposing the cover over the substrate within the cover attach area to press the adhesive material into or against the containment structure.

In another embodiment, the present invention is a method of making a semiconductor device comprising the steps of providing a substrate, forming a containment structure over a surface of the substrate, providing a cover, depositing an adhesive material over the cover or substrate, and disposing the cover over the substrate with the containment structure controlling outward flow of the adhesive material.

In another embodiment, the present invention is a semiconductor device comprising a substrate and containment structure formed over a surface of the substrate. An adhesive material is deposited over a cover or substrate. The cover is disposed over the substrate and the containment structure controls outward flow of the adhesive material.

In another embodiment, the present invention is a method of making a semiconductor device comprising the steps of providing a substrate, forming an anisotropic conductive layer over the substrate, disposing a semiconductor die over the substrate by compressing the semiconductor die into the anisotropic conductive layer, and disposing a cover over the semiconductor die and substrate by compressing the cover into the anisotropic conductive layer.

BRIEF DESCRIPTION OF THE DRAWINGS

FIGS. 5a-5b illustrate a process of mounting a shielding layer to a semiconductor die and interposer with an adhesive material blocked by a channel and dam material;

FIGS. 6a-6e illustrate a process of mounting a heat spreader to a semiconductor die and interposer with an adhesive material blocked by dam material;

FIGS. 7a-7e illustrate a process of mounting a heat spreader to a semiconductor die and interposer with an adhesive material blocked by two channels and dam material;

FIGS. 8a-8e illustrate a process of mounting a heat spreader to a semiconductor die and interposer with an adhesive material blocked by a channel and two dam materials;

FIGS. 9a-9f illustrate a process of mounting a heat spreader to a semiconductor die and interposer with ACF material; and FIGS. 10a-10f illustrate another process of mounting a heat spreader to a semiconductor die and interposer with ACF material.

DETAILED DESCRIPTION OF THE DRAWINGS

Figure 1:
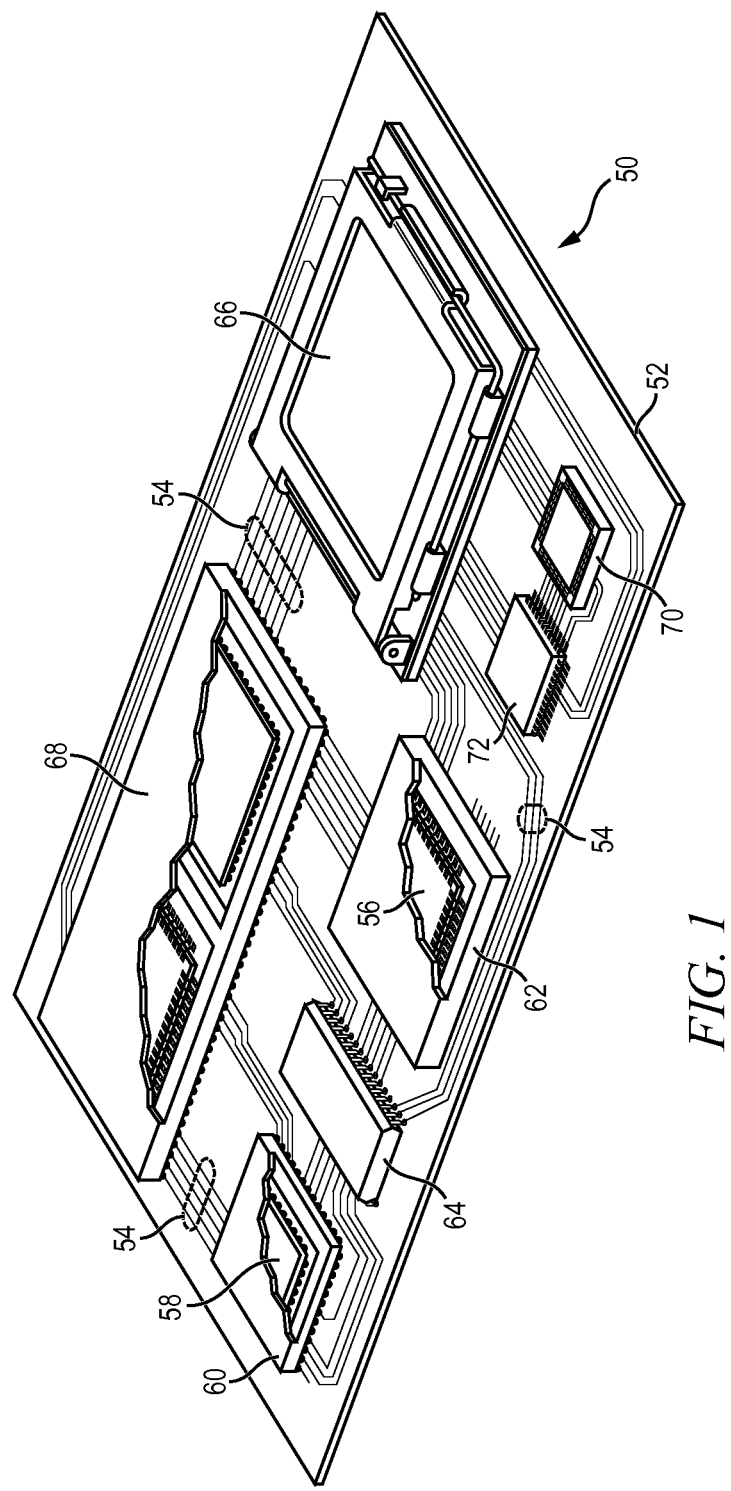
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
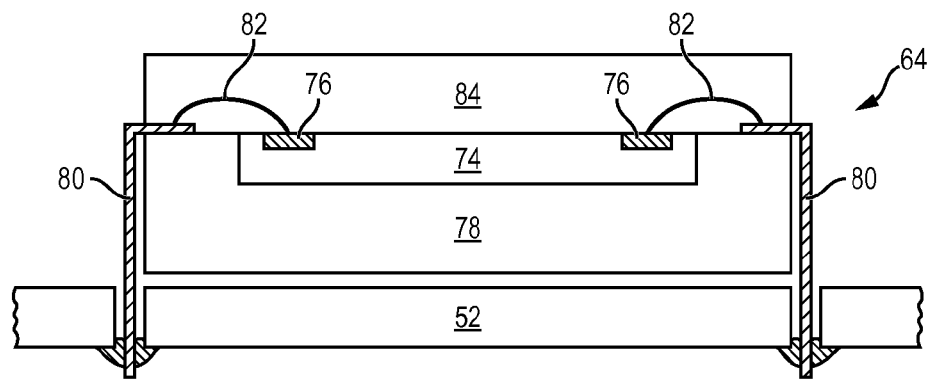
FIGS. 2a-2c illustrate further detail of the representative semiconductor packages mounted to the PCB.
Figure 2B:
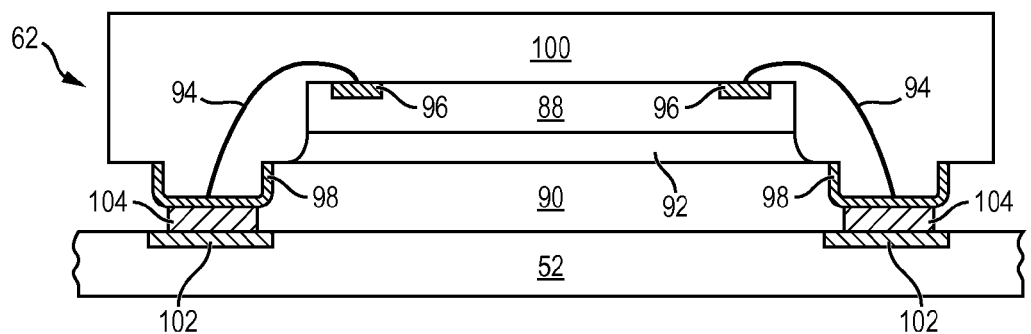
Figure 2C:
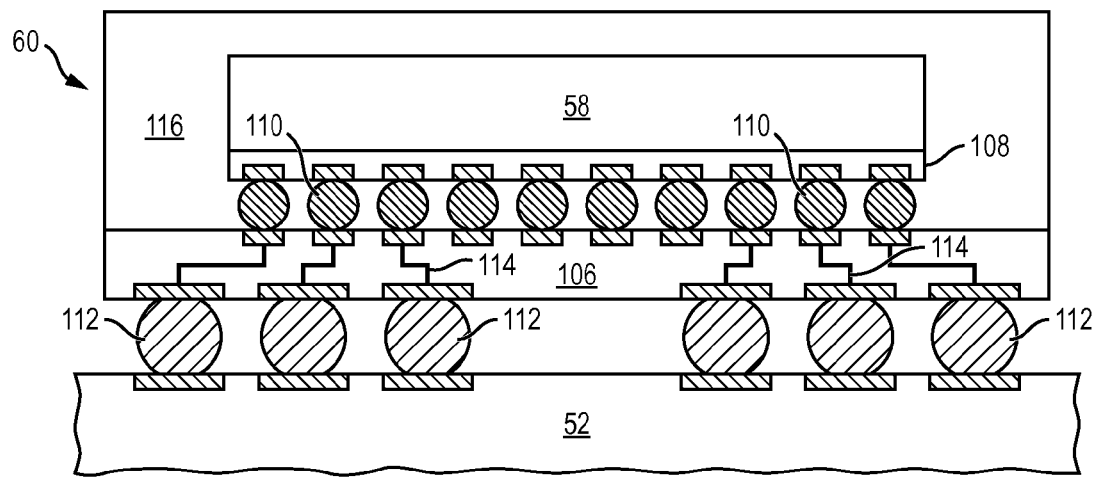

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted to carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
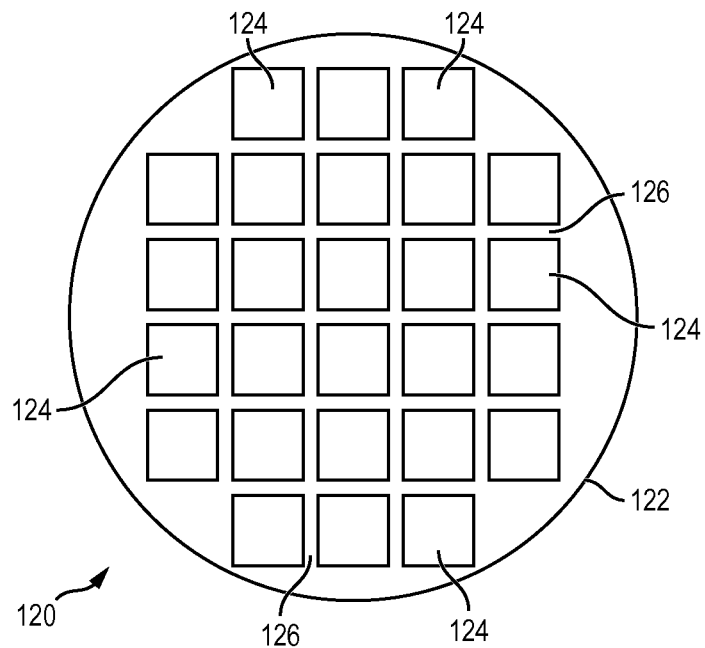
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
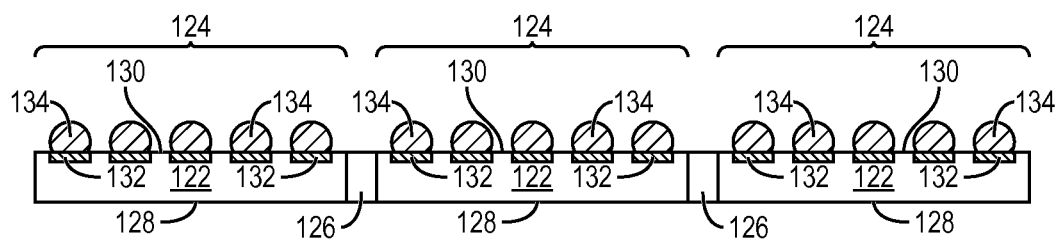

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded to contact pads 132. Bumps 134 represent one type of interconnect structure that can be formed over contact pads 132. The interconnect structure can also use stud bump, micro bump, or other electrical interconnect.

Figure 3C:
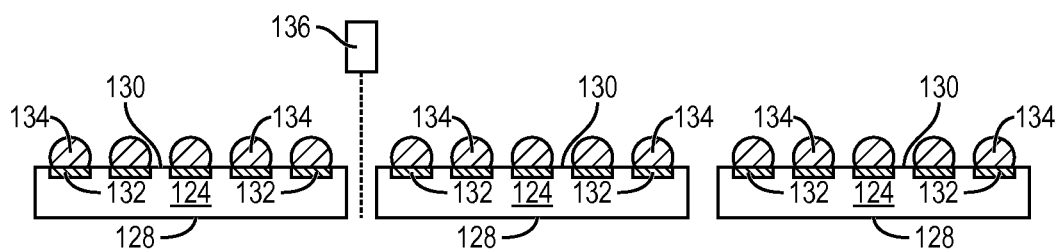

In FIG. 3c, semiconductor wafer 120 is singulated through saw street 126 using a saw blade or laser cutting tool 136 into individual semiconductor die 124.

FIGS. 4a-4n illustrate, in relation to FIGS. 1 and 2a-2c, a process of mounting a heat spreader to a semiconductor die and interposer with an adhesive material blocked by a channel and dam material. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer flexible laminate, ceramic, or leadframe. Substrate 144 is mounted to interface layer 142 over carrier 140.

In FIG. 4b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 148 is removed by an etching process to expose substrate 144 and conductive vias 146.

An electrically conductive layer or RDL 150 is formed over the exposed substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

In FIG. 4c, a substrate or carrier 154 contains temporary or sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of $SiO_2$, $Si_3N_4$, SiON, $Ta_2O_5$, $Al_2O_3$, or other material having similar insulating and structural properties. A portion of insulating layer 158 is removed by an etching process to expose substrate 144 and conductive vias 146.

An electrically conductive layer or RDL 160 is formed over the exposed substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146. In another embodiment, conductive vias 146 are formed through substrate 144 after forming conductive layers 150 and/or 160. Carrier 154 and interface layer 156 are removed by chemical etching, mechanical peeling, CMP, mechanical grinding, thermal bake, UV light, laser scanning, or wet stripping to expose a surface of substrate 144, including insulating layer 148 and conductive layer 160.

Figure 4D:
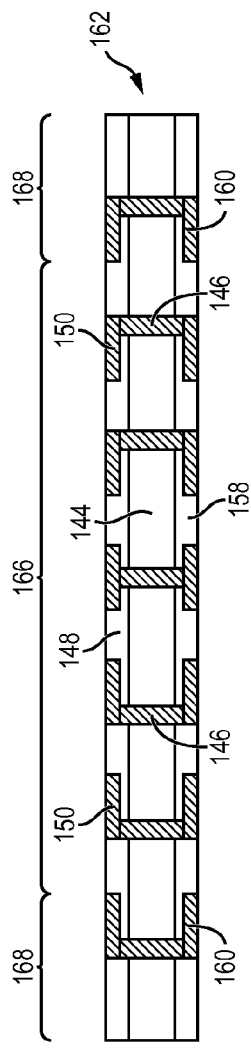
FIGS. 4a-4n illustrate a process of mounting a heat spreader to a semiconductor die and interposer with an adhesive material blocked by a channel and dam material.

The interposer or substrate 162 shown in FIG. 4d provides electrical interconnect vertically and laterally across the interposer through conductive layers 150 and 160 and conductive vias 146 according to the electrical function of semiconductor die 124. A top surface of interposer 162 has a die attach area 166 designated for mounting semiconductor die 124 and cover attach area 168 designed as mounting point for a cover, such as a heat spreader or shielding layer. The die attach area 166 is generally located within an interior space of interposer 162. Cover attach area 168 is located around die attach area 166, outside a footprint of the later-mounted semiconductor die 124, i.e., around a perimeter region of interposer 162.

Figure 4E:
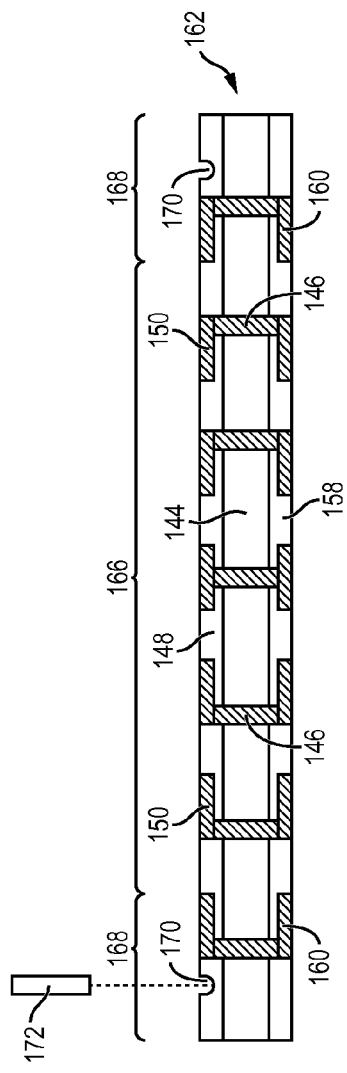

In FIG. 4e, a groove or channel 170 is cut into insulating material 148 of interposer 162 using saw blade or laser cutting tool 172. Channel 170 is formed into a surface of interposer 162 partially or completely around a perimeter of die attach area 166 and within cover attach area 168.

Figure 4F:
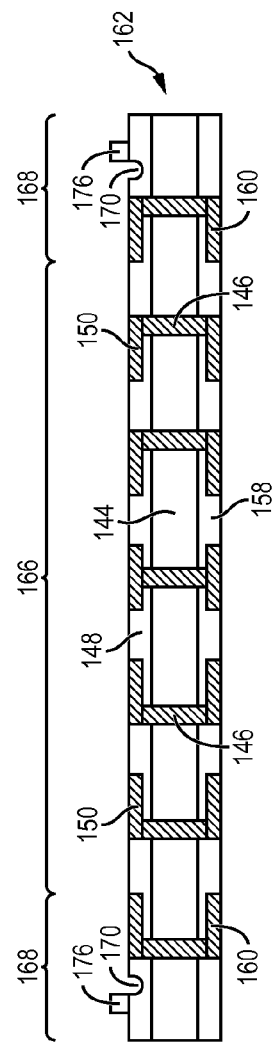

In FIG. 4f, a dam material 176 is formed over a surface of interposer 162 within cover attach area 168 and between channel 170 and an edge of the interposer. In this case, dam material 176 is formed partially or completely around a perimeter of channel 170, i.e., on the outside of the channel proximate to the edge of interposer 162. Dam material 176 can be solder resist, adhesive, insulation, polymer, metal, or other suitable barrier material. Dam material 176 is formed by screen printing, electrolytic plating, electroless plating, spray coating, or other suitable deposition process depending on the material. In one embodiment, channel 170 has a depth of 5 micrometers (µm) into insulating layer 148 and dam material 176 has a height of 5 µm extending above the insulating layer.

Figure 4G:
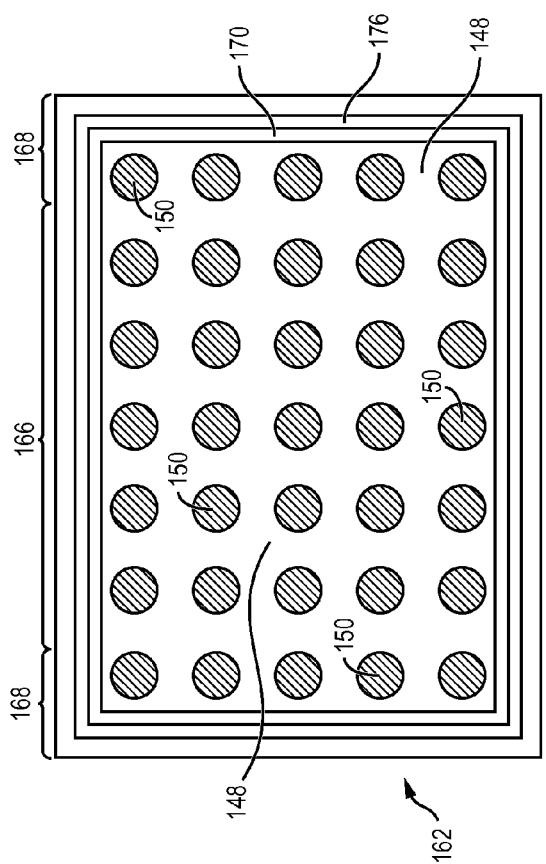

FIG. 4g shows a top view of interposer 162 with channel 170 formed around the perimeter of die attach area 166 and dam material 176 formed around the perimeter of channel 170 proximate to the edge of the interposer. Channel 170 and dam material 176 are both disposed within cover attach area 168.

Figure 4H:
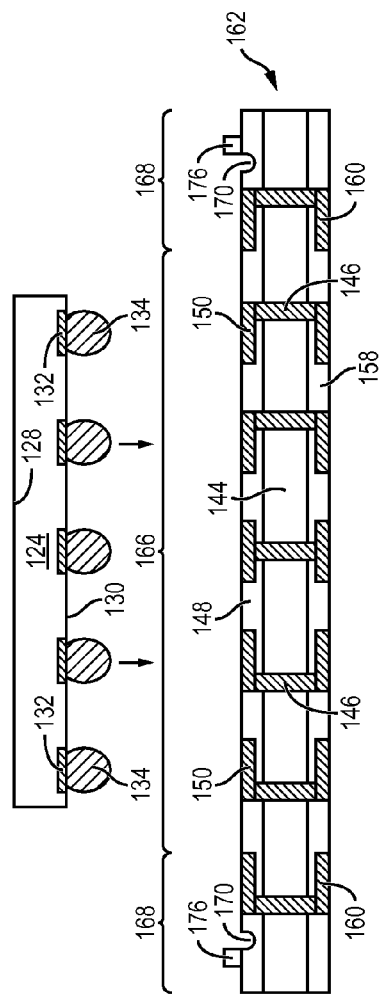
Figure 4I:
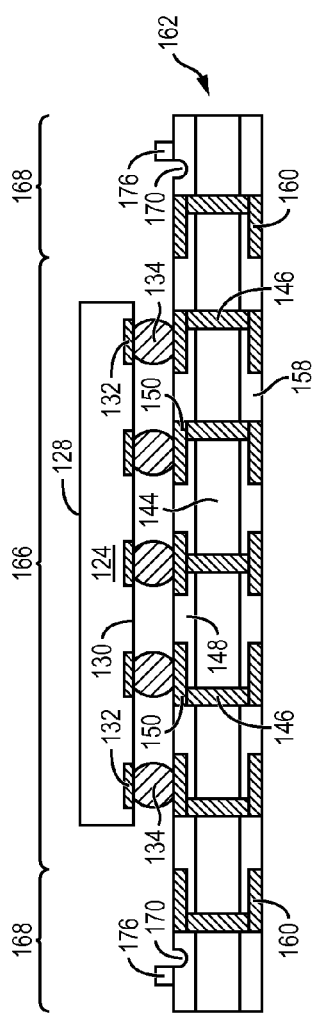
Figure 4J:
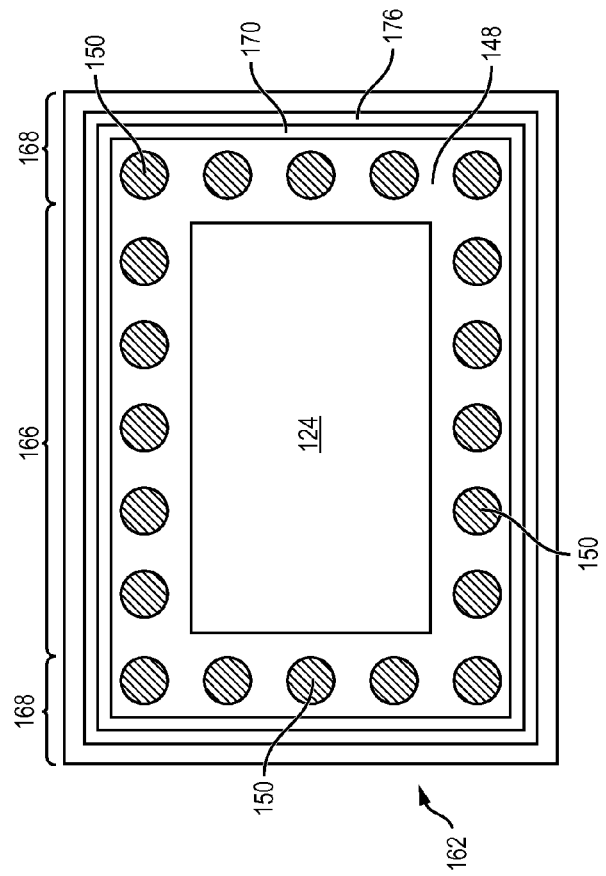

In FIG. 4h, semiconductor die 124 from FIGS. 3a-3c is aligned to die attach area 166 and mounted to interposer 162 by reflowing bumps 134 to metallurgically and electrically connect the bumps to conductive layer 150. Alternatively, a package-on-package (PoP) semiconductor device can be mounted to die attach area 166 of interposer 162. FIG. 4i shows a cross-sectional view of semiconductor die 124 mounted to interposer 162. Bumps 134 are electrically connected to conductive layers 150 and 160 and conductive vias 146 in accordance with the electrical design and function of semiconductor die 124. FIG. 4j shows a top view of semiconductor die 124 mounted to interposer 162 with channel 170 formed around the semiconductor die and dam material 176 formed around channel 170 proximate to the edge of the interposer.

In FIG. 4k, an underfill material 178, such as epoxy resin, is deposited between semiconductor die 124 and interposer 162. A conductive adhesive material 180 is deposited over insulating layer 148 and conductive layer 150 and within cover attach area 168. Adhesive material 180 can be an epoxy resin containing butadiene-acrylonitrile rubber with a carboxyl group as a fluxing agent, acid anhydride curing agent, and curing accelerator. Suitable epoxy resins include epoxy resin of bisphenol-A, epoxy resin of bisphenol-F, epoxy resin of phenol novolak, epoxy resin of bisphenol AD, epoxy resin of biphenyl, epoxy resin of naphthalene, alicyclic epoxy resin, epoxy resin of glycidyl ester, epoxy resin of glycidyl amine, heterocyclic epoxy resin, epoxy resin of diallyl sulfone, and epoxy resin of hydroquinone. In other embodiments, adhesive material 180 can be SE4450 from Dow Corning, Epinal EN4900F from Hitachi Chemical, or 2000T from Henkel.

Adhesive material 180 is deposited over cover attach area 168 inboard and away from channel 170 and dam material 176, as shown in FIG. 4k. That is, adhesive material 180 is not initially disposed within channel 170, nor does the adhesive material contact dam material 176. Rather there is a gap between adhesive material 180 and channel 170. A sufficient quantity of adhesive material 180 is deposited over insulating layer 148 and conductive layer 150 and within cover attach area 168 such that the initial thickness of the adhesive material is greater than a height of dam material 176. In one embodiment, adhesive material 180 is deposited continuously around cover attach area 168. The thick layer of adhesive material 180 is later compressed and forced into channel 170 and against dam material 176 when the heat spreader is pressed into place.

In FIG. 4l, a thermal interface material (TIM) 182 is deposited over back surface 128 of semiconductor die 124. TIM 182 is a thermal epoxy, thermal epoxy resin, or thermal conductive paste. Heat spreader or heat sink 184 is positioned over and mounted to cover attach area 168 of interposer 162 and TIM 182 over semiconductor die 124. Heat spreader 184 can be Cu, Al, or other material with high thermal conductivity.

In another embodiment, TIM 182 can be applied to underside of horizontal portion 184a prior to mounting heat spreader 184 to interposer 162. In addition, semiconductor die 124 can be mounted to heat spreader 184 with back surface 128 bonded to TIM 182 on the underside of horizontal portion 184a. The heat spreader and semiconductor die assembly is then mounted to interposer 162.

Heat spreader 184 is mounted to interposer 162 by aligning down-step portions 184b to cover attach area 168 and applying a force to a back surface of the heat spreader. The horizontal portion 184a of heat spreader 184 bonds to TIM 182 on back surface 128 of semiconductor die 124. The down-step portions 184b of heat spreader 184 contact a top surface of dam material 176. Dam material 176 provides an even and solid base support for down-step portions 184b to reduce tilt of heat spreader 184 during the mounting process. The down-step portions 184b also press down on conductive adhesive layer 180. As heat spreader 184 is pressed into place, the thick layer of conductive adhesive material 180 spreads laterally with excess adhesive material filling channel 170. Dam material 176 blocks bleed-out or further spreading of conductive adhesive layer 180 outwardly from interposer 162.

FIG. 4m shows heat spreader 184 mounted to semiconductor die 124 and interposer 162 with conductive adhesive layer 180 contained within heat spreader attach area 168. Adhesive material 180 bonds down-step portions 184b of heat spreader 184 to insulating layer 148 and conductive layer 150 of interposer 162. Dam material 176 and channel 170 contain the compressed conductive adhesive layer 180 within cover attach area 168. Heat spreader 184 and TIM 182 form a thermal conduction path that distributes and dissipates the heat generated by semiconductor die 124 and increases the thermal performance of eWLB semiconductor package 186. Conductive adhesive material 180 thermally conducts a portion of the heat from semiconductor die 124 through heat spreader 184 and conductive layers 150 and 160 and conductive vias 146 of interposer 162.

In FIG. 4n, an electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 188. In some applications, bumps 188 are reflowed a second time to improve electrical contact to conductive layer 160. Bumps 188 can also be compression bonded to conductive layer 160. Bumps 188 represent one type of interconnect structure that can be formed over conductive layer 160. The interconnect structure can also use bond wires, stud bump, micro bump, or other electrical interconnect.

FIGS. 5a-5b shows another embodiment of eWLB semiconductor package 194 with EMI and EFI shielding layer 190 mounted to semiconductor die 124 and interposer 162. Semiconductor die 124 may contain baseband circuits that generate EMI, RFI, or other inter-device interference, such as capacitive, inductive, or conductive coupling. In other embodiments, semiconductor die 124 contain IPDs that are susceptible to EMI, RFI, and inter-device interference. For example, the IPDs contained within semiconductor die 124 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

Continuing from FIG. 4k, an adhesive material 192 is deposited over back surface 128 of semiconductor die 124, as shown in FIG. 5a. To reduce the effects of EMI and RFI, the cover over semiconductor die 124 is a shielding layer 190 positioned over and mounted to semiconductor die 124 and interposer 162. Shielding layer 190 can be one or more layers of Al, Cu, ferrite or carbonyl iron, stainless steel, nickel silver, low-carbon steel, silicon-iron steel, foil, conductive resin, conductive paste, and other metals and composites capable of blocking or absorbing EMI, RFI, and other inter-device interference. In another embodiment, shielding layer 190 can be a non-metal material such as carbon-black or aluminum flake to reduce the effects of EMI and RFI.

Shielding layer 190 is mounted to interposer 162 by aligning down-step portions 190b to cover attach area 168 and applying a force to a back surface of the shielding layer. The horizontal portion 190a of shielding layer 190 bonds to adhesive layer 192 on back surface 128 of semiconductor die 124. The down-step portions 190b of shielding layer 190 contact a top surface of dam material 176. Dam material 176 provides an even and solid base support for down-step portions 190b to reduce tilt of shielding layer 190 during the mounting process. The down-step portions 190b also press down on conductive adhesive layer 180. As shielding layer 190 is pressed into place, the thick layer of conductive adhesive material 180 spreads laterally with excess adhesive material filling channel 170. Dam material 176 blocks bleed-out or further spreading of conductive adhesive layer 180 outwardly from interposer 162.

FIG. 5b shows shielding layer 190 mounted to semiconductor die 124 and interposer 162 with conductive adhesive layer 180 contained within shielding attach area 168. Adhesive material 180 bonds down-step portions 190b of shielding layer 190 to insulating layer 148 and conductive layer 150 of interposer 162. Dam material 176 and channel 170 contain the compressed conductive adhesive layer 180 within cover attach area 168. Conductive adhesive material 180 provides a ground path from shielding layer 190 through interposer 162 and bumps 188 to an external low impedance ground point for eWLB semiconductor package 194.

In another embodiment, adhesive layer 192 can be applied to underside of horizontal portion 190a prior to mounting shielding layer 190 to interposer 162. In addition, semiconductor die 124 can be mounted to shielding layer 190 with back surface 128 bonded to adhesive layer 192 on the underside of horizontal portion 190a. The shielding layer and semiconductor die assembly is then mounted to interposer 162.

FIGS. 6a-6e illustrate another embodiment of mounting a heat spreader to a semiconductor die and interposer with a dam material. Continuing from the structure shown in FIG. 4d, a dam material 196 is formed over a surface of interposer 162 around a perimeter of die attach area 198 and within cover attach area 200 proximate to an edge of the interposer, as shown in FIG. 6a. Dam material 196 is formed partially or completely around a perimeter of die attach area 198, proximate to the edge of interposer 162. Dam material 196 can be solder resist, adhesive, insulation, polymer, metal, or other suitable barrier material. Dam material 196 is formed by screen printing, electrolytic plating, electroless plating, spray coating, or other suitable deposition process depending on the material. In one embodiment, dam material 196 has a height of 5 μm extending above insulating layer 148.

Semiconductor die 124 from FIGS. 3a-3c is aligned to die attach area 198 and mounted to interposer 162 by reflowing bumps 134 to metallurgically and electrically connect the bumps to conductive layer 150, similar to FIGS. 4h-4i. Alternatively, a PoP semiconductor device can be mounted to die attach area 198 of interposer 162. Bumps 134 are electrically connected to conductive layers 150 and 160 and conductive vias 146 in accordance with the electrical design and function of semiconductor die 124. An underfill material 202, such as epoxy resin, is deposited between semiconductor die 124 and interposer 162. FIG. 6b shows a top view of semiconductor die 124 mounted to interposer 162 with dam material 196 formed within cover attach area 200 proximate to the edge of interposer 162.

In FIG. 6c, a conductive adhesive material 204 is deposited over insulating layer 148 and conductive layer 150 and within cover attach area 200. Adhesive material 204 can be an epoxy resin containing butadiene-acrylonitrile rubber with a carboxyl group as a fluxing agent, acid anhydride curing agent, and curing accelerator. Suitable epoxy resins include epoxy resin of bisphenol-A, epoxy resin of bisphenol-F, epoxy resin of phenol novolak, epoxy resin of bisphenol AD, epoxy resin of biphenyl, epoxy resin of naphthalene, alicyclic epoxy resin, epoxy resin of glycidyl ester, epoxy resin of glycidyl amine, heterocyclic epoxy resin, epoxy resin of diallyl sulfone, and epoxy resin of hydroquinone. In other embodiments, adhesive material 204 can be SE4450 from Dow Corning, Epinal EN4900F from Hitachi Chemical, or 2000T from Henkel.

Adhesive material 204 is deposited over cover attach area 200 inboard and away from dam material 196, as shown in FIG. 6c. That is, adhesive material 204 does not initially contact dam material 196. Rather there is a gap between adhesive material 204 and dam material 196. A sufficient quantity of adhesive material 204 is deposited over insulating layer 148 and conductive layer 150 and within cover attach area 200 such that the initial thickness of the adhesive material is greater than a height of dam material 196. In one embodiment, adhesive material 204 is deposited continuously around cover attach area 200. The thick layer of adhesive material 204 is later compressed and forced against dam material 196 when the heat spreader is pressed into place.

In FIG. 6d, a TIM 208 is deposited over back surface 128 of semiconductor die 124. TIM 208 is a thermal epoxy, thermal epoxy resin, or thermal conductive paste. Heat spreader or heat sink 210 is positioned over and mounted to cover attach area 200 of interposer 162 and TIM 208 over semiconductor die 124. Heat spreader 210 can be Cu, Al, or other material with high thermal conductivity.

In another embodiment, TIM 208 can be applied to underside of horizontal portion 210a prior to mounting heat spreader 210 to interposer 162. In addition, semiconductor die 124 can be mounted to heat spreader 210 with back surface 128 bonded to TIM 208 on the underside of horizontal portion 210a. The heat spreader and semiconductor die assembly is then mounted to interposer 162.

Heat spreader 210 is mounted to interposer 162 by aligning down-step portions 210b to cover attach area 200 and applying a force to a back surface of the heat spreader. The horizontal portion 210a of heat spreader 210 bonds to TIM 208 on back surface 128 of semiconductor die 124. The down-step portions 210b of heat spreader 210 contact a top surface of dam material 196. Dam material 196 provides an even and solid base support for down-step portions 210b to reduce tilt of heat spreader 210 during the mounting process. The down-step portions 210b also press down on conductive adhesive layer 204. As heat spreader 210 is pressed into place, the thick layer of conductive adhesive material 204 spreads laterally across insulating layer 148 and conductive layer 150 over cover attach area 200 to dam material 196. Dam material 196 blocks bleed-out or further spreading of the conductive adhesive layer outwardly from interposer 162.

FIG. 6e shows heat spreader 210 mounted to semiconductor die 124 and interposer 162 with conductive adhesive layer 204 contained within heat spreader attach area 200. Adhesive material 204 bonds down-step portions 210b of heat spreader 210 to insulating layer 148 and conductive layer 150 of interposer 162. Dam material 196 contains conductive adhesive layer 204 within cover attach area 200. Heat spreader 210 and TIM 208 form a thermal conduction path that distributes and dissipates the heat generated by semiconductor die 124 and increases the thermal performance of semiconductor package 212. Conductive adhesive material 204 thermally conducts a portion of the heat from semiconductor die 124 through heat spreader 210 and conductive layers 150 and 160 and conductive vias 146 of interposer 162. An EMI and RFI shielding layer can also be mounted to semiconductor die 124 and interposer 162, as described in FIGS. 5a-5b.

An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 214. In some applications, bumps 214 are reflowed a second time to improve electrical contact to conductive layer 160. Bumps 214 can also be compression bonded to conductive layer 160. Bumps 214 represent one type of interconnect structure that can be formed over conductive layer 160. The interconnect structure can also use bond wires, stud bump, micro bump, or other electrical interconnect.

Figure 7D:
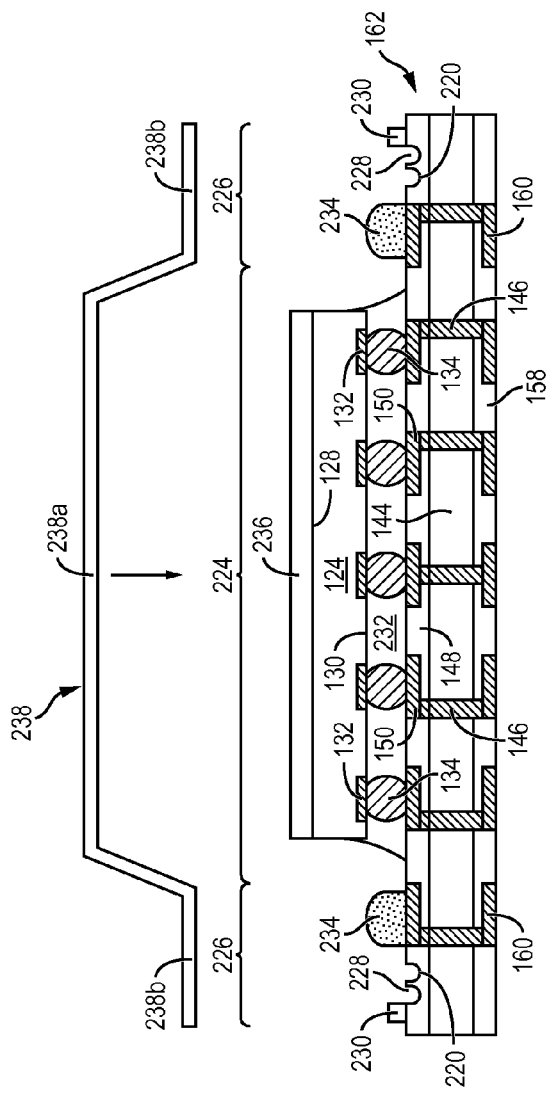

FIGS. 7a-7e illustrate another embodiment of mounting a heat spreader to a semiconductor die and interposer with first and second channels and dam material. Continuing from the structure shown in FIG. 4d, a first groove or channel 220 is cut into insulating material 148 of interposer 162 using saw blade or laser cutting tool 222, as shown in FIG. 7a. Channel 220 is formed partially or completely around a perimeter of die attach area 224 and within cover attach area 226. A second groove or channel 228 is cut into insulating material 148 of interposer 162 around a perimeter of channel 220 using saw blade or laser cutting tool 222. Channel 228 is formed partially or completely around a perimeter of channel 220 and within cover attach area 226.

A dam material 230 is formed over a surface of interposer 162 within cover attach area 226 and between channel 228 and an edge of the interposer. In this case, dam material 230 is formed partially or completely around a perimeter of channel 228, i.e., on the outside of the channel proximate to the edge of interposer 162. Dam material 230 can be solder resist, adhesive, insulation, polymer, metal, or other suitable barrier material. Dam material 230 is formed by screen printing, electrolytic plating, electroless plating, spray coating, or other suitable deposition process depending on the material. In one embodiment, channels 220 and 228 have a depth of 5 µm into insulating layer 148 and dam material 230 has a height of 5 µm extending above the insulating layer.

Semiconductor die 124 from FIGS. 3a-3c is aligned to die attach area 224 and mounted to interposer 162 by reflowing bumps 134 to metallurgically and electrically connect the bumps to conductive layer 150, similar to FIGS. 4h-4i. Alternatively, a PoP semiconductor device can be mounted to die attach area 224 of interposer 162. Bumps 134 are electrically connected to conductive layers 150 and 160 and conductive vias 146 in accordance with the electrical design and function of semiconductor die 124. An underfill material 232, such as epoxy resin, is deposited between semiconductor die 124 and interposer 162. FIG. 7b shows a top view of semiconductor die 124 mounted to interposer 162 with channels 220 and 228 and dam material 230 formed within cover attach area 226.

In FIG. 7c, a conductive adhesive material 234 is deposited over insulating layer 148 and conductive layer 150 and within cover attach area 226. Adhesive material 234 can be an epoxy resin containing butadiene-acrylonitrile rubber with a carboxyl group as a fluxing agent, acid anhydride curing agent, and curing accelerator. Suitable epoxy resins include epoxy resin of bisphenol-A, epoxy resin of bisphenol-F, epoxy resin of phenol novolak, epoxy resin of bisphenol AD, epoxy resin of biphenyl, epoxy resin of naphthalene, alicyclic epoxy resin, epoxy resin of glycidyl ester, epoxy resin of glycidyl amine, heterocyclic epoxy resin, epoxy resin of diallyl sulfone, and epoxy resin of hydroquinone. In other embodiments, adhesive material 234 can be SE4450 from Dow Corning, Epinal EN4900F from Hitachi Chemical, or 2000T from Henkel.

Adhesive material 234 is deposited over cover attach area 226 inboard and away from channels 220 and 228 and dam material 230, as shown in FIG. 7c. That is, adhesive material 234 is not initially disposed within channels 220 and 228, nor does the adhesive material contact dam material 230. Rather there is a gap between adhesive material 234 and channel 220. A sufficient quantity of adhesive material 234 is deposited over insulating layer 148 and conductive layer 150 and within cover attach area 226 such that the initial thickness of the adhesive material is greater than a height of dam material 230. In one embodiment, adhesive material 204 is deposited continuously around cover attach area 226. The thick layer of adhesive material 234 is later compressed and forced into channels 220 and 228 and against dam material 230 when the heat spreader is pressed into place.

In FIG. 7d, a TIM 236 is deposited over back surface 128 of semiconductor die 124. TIM 236 is a thermal epoxy, thermal epoxy resin, or thermal conductive paste. Heat spreader or heat sink 238 is positioned over and mounted to cover attach area 226 of interposer 162 and TIM 236 over semiconductor die 124. Heat spreader 238 can be Cu, Al, or other material with high thermal conductivity.

In another embodiment, TIM 236 can be applied to underside of horizontal portion 238a prior to mounting heat spreader 238 to interposer 162. In addition, semiconductor die 124 can be mounted to heat spreader 238 with back surface 128 bonded to TIM 236 on the underside of horizontal portion 238a. The heat spreader and semiconductor die assembly is then mounted to interposer 162.

Heat spreader 238 is mounted to interposer 162 by aligning down-step portions 238b to cover attach area 226 and applying a force to a back surface of the heat spreader. The horizontal portion 238a of heat spreader 238 bonds to TIM 236 on back surface 128 of semiconductor die 124. The down-step portions 238b of heat spreader 238 contact a top surface of dam material 230. Dam material 230 provides an even and solid base support for down-step portions 238b to reduce tilt of heat spreader 238 during the mounting process. The down-step portions 238b also press down on conductive adhesive layer 234. As heat spreader 238 is pressed into place, the thick layer of conductive adhesive material 234 spreads laterally with excess adhesive material filling channels 220 and 228. Dam material 230 blocks bleed-out or further spreading of conductive adhesive layer 234 outwardly from interposer 162.

Figure 7E:
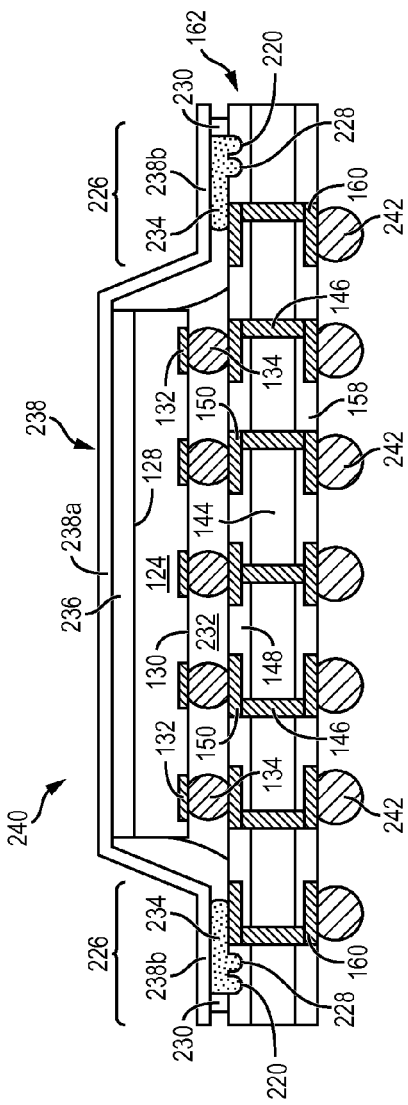

FIG. 7e shows heat spreader 238 mounted to semiconductor die 124 and interposer 162 with conductive adhesive layer 234 contained within heat spreader attach area 226. Adhesive material 234 bonds down-step portions 238b of heat spreader 238 to insulating layer 148 and conductive layer 150 of interposer 162. Dam material 230 and channels 220 and 228 contain the compressed conductive adhesive layer 234 within cover attach area 226. Heat spreader 238 and TIM 236 form a thermal conduction path that distributes and dissipates the heat generated by semiconductor die 124 and increases the thermal performance of semiconductor package 240. Conductive adhesive material 234 thermally conducts a portion of the heat from semiconductor die 124 through heat spreader 238 and conductive layers 150 and 160 and conductive vias 146 of interposer 162. An EMI and RFI shielding layer can also be mounted to semiconductor die 124 and interposer 162, as described in FIGS. 5a-5b.

An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 242. In some applications, bumps 242 are reflowed a second time to improve electrical contact to conductive layer 160. Bumps 242 can also be compression bonded to conductive layer 160. Bumps 242 represent one type of interconnect structure that can be formed over conductive layer 160. The interconnect structure can also use bond wires, stud bump, micro bump, or other electrical interconnect.

Figure 8A:
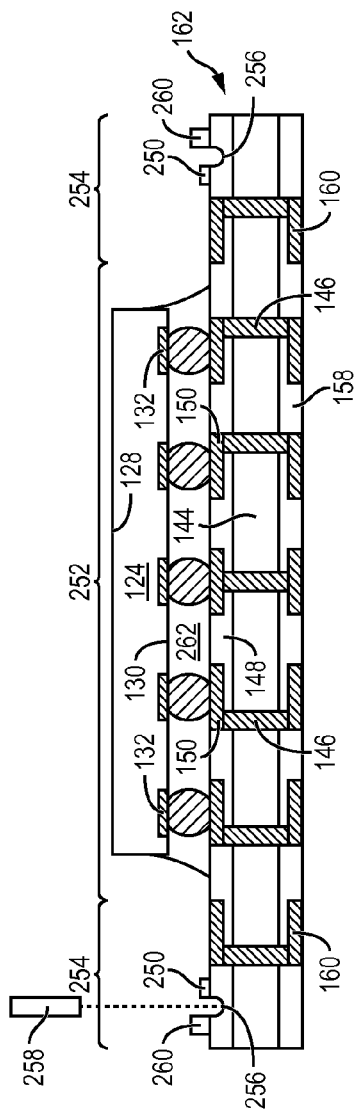

FIGS. 8a-8e illustrate another embodiment of mounting a heat spreader to a semiconductor die and interposer with a channel and first and second dam materials. Continuing from the structure shown in FIG. 4d, a first dam material 250 is formed over a surface interposer 162 within cover attach area 254, as shown in FIG. 8a. Dam material 250 can be formed partially or completely around a perimeter of die attach area 252. A groove or channel 256 is cut into insulating material 148 of interposer 162 using saw blade or laser cutting tool 258. Channel 256 is formed partially or completely around a perimeter of dam material 250 within cover attach area 254. A second dam material 260 is formed over a surface of interposer 162 and within cover attach area 254 proximate to an edge of the interposer. Dam material 260 can be formed partially or completely around a perimeter of channel 256 and within cover attach area 254. Dam materials 250 and 260 can be solder resist, adhesive, insulation, polymer, metal, or other suitable barrier material. Dam materials 250 and 260 are formed by screen printing, electrolytic plating, electroless plating, spray coating, or other suitable deposition process depending on the material. In one embodiment, channel 256 has a depth of 5 µm into insulating layer 148, dam material 260 has a height of 5 µm extending above the insulating layer, and dam material 250 has a height of less than the height of dam material 260, e.g., 2.5 µm above the insulating layer.

Figure 8B:
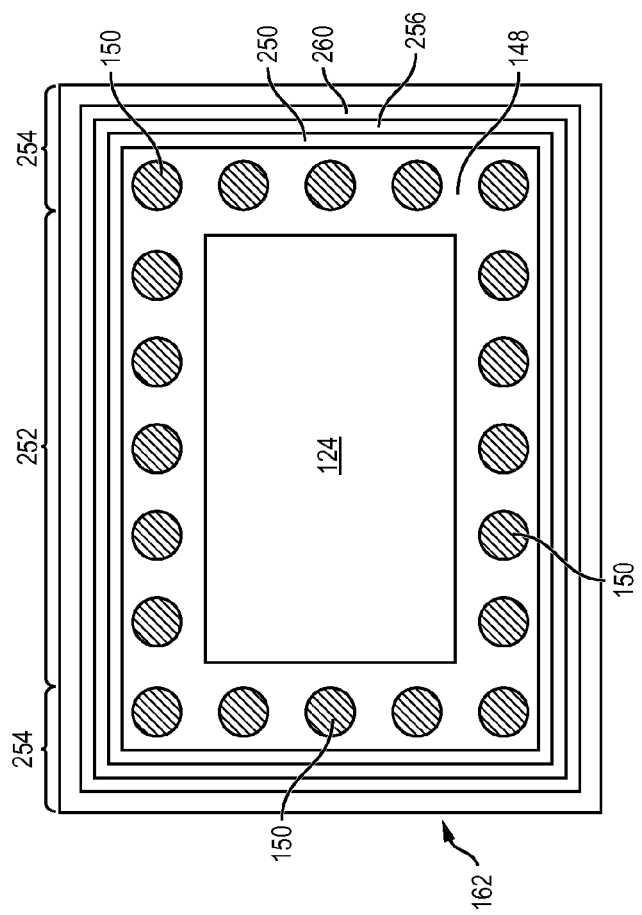

Semiconductor die 124 from FIGS. 3a-3c is aligned to die attach area 252 and mounted to interposer 162 by reflowing bumps 134 to metallurgically and electrically connect the bumps to conductive layer 150, similar to FIGS. 4h-4i. Alternatively, a PoP semiconductor device can be mounted to die attach area 252 of interposer 162. Bumps 134 are electrically connected to conductive layers 150 and 160 and conductive vias 146 in accordance with the electrical design and function of semiconductor die 124. An underfill material 262, such as epoxy resin, is deposited between semiconductor die 124 and interposer 162. FIG. 8b shows a top view of semiconductor die 124 mounted to interposer 162 with dam materials 250 and 260 and channel 256 formed within cover attach area 254.

In FIG. 8c, a conductive adhesive material 264 is deposited over insulating layer 148 and conductive layer 150 and within cover attach area 254. Adhesive material 264 can be an epoxy resin containing butadiene-acrylonitrile rubber with a carboxyl group as a fluxing agent, acid anhydride curing agent, and curing accelerator. Suitable epoxy resins include epoxy resin of bisphenol-A, epoxy resin of bisphenol-F, epoxy resin of phenol novolak, epoxy resin of bisphenol AD, epoxy resin of biphenyl, epoxy resin of naphthalene, alicyclic epoxy resin, epoxy resin of glycidyl ester, epoxy resin of glycidyl amine, heterocyclic epoxy resin, epoxy resin of diallyl sulfone, and epoxy resin of hydroquinone. In other embodiments, adhesive material 264 can be SE4450 from Dow Corning, Epinal EN4900F from Hitachi Chemical, or 2000T from Henkel.

Adhesive material 264 is deposited over cover attach area 254 inboard and away from dam materials 250 and 260 and channel 256, as shown in FIG. 8c. That is, adhesive material 264 is not initially disposed within channel 256, nor does the adhesive material contact dam materials 250 or 260. Rather there is a gap between adhesive material 264 and dam material 250. A sufficient quantity of adhesive material 264 is deposited over insulating layer 148 and conductive layer 150 and within cover attach area 254 such that the initial thickness of the adhesive material is greater than a height of dam material 260. In one embodiment, adhesive material 264 is deposited continuously around cover attach area 254. The thick layer of adhesive material 264 is later compressed and forced over dam material 250 and into channel 256 and against dam material 260 when the heat spreader is pressed into place.

In FIG. 8d, a TIM 266 is deposited over back surface 128 of semiconductor die 124. TIM 266 is a thermal epoxy, thermal epoxy resin, or thermal conductive paste. Heat spreader or heat sink 268 is positioned over and mounted to cover attach area 254 of interposer 162 and TIM 266 over semiconductor die 124. Heat spreader 268 can be Cu, Al, or other material with high thermal conductivity.

In another embodiment, TIM 266 can be applied to underside of horizontal portion 268a prior to mounting heat spreader 268 to interposer 162. In addition, semiconductor die 124 can be mounted to heat spreader 268 with back surface 128 bonded to TIM 266 on the underside of horizontal portion 268a. The heat spreader and semiconductor die assembly is then mounted to interposer 162.

Heat spreader 268 is mounted to interposer 162 by aligning down-step portions 268b to cover attach area 254 and applying a force to a back surface of the heat spreader. The horizontal portion 268a of heat spreader 268 bonds to TIM 266 on back surface 128 of semiconductor die 124. The down-step portions 268b of heat spreader 268 contact a top surface of dam material 260. Dam material 260 provides an even and solid base support for down-step portions 268b to reduce tilt of heat spreader 268 during the mounting process. The down-step portions 268b also press down on conductive adhesive layer 264. As heat spreader 268 is pressed into place, the thick layer of conductive adhesive material 264 spreads laterally with excess adhesive material spreading over dam material 250 and filling channel 256. Dam material 260 blocks bleed-out or further spreading of conductive adhesive layer 264 outwardly from interposer 162.

Figure 8E:
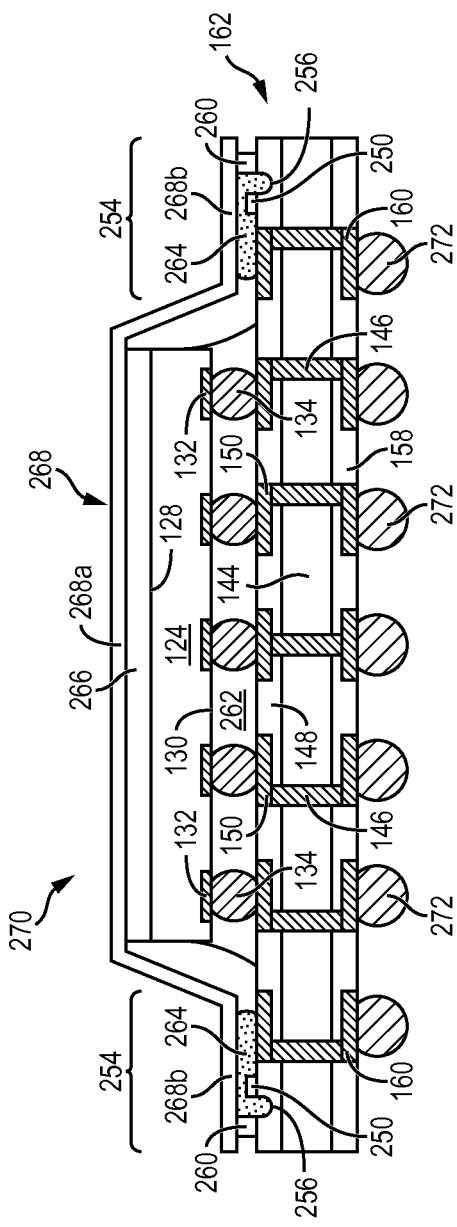

FIG. 8e shows heat spreader 268 mounted to semiconductor die 124 and interposer 162 with conductive adhesive layer 264 contained within heat spreader attach area 254. Adhesive material 264 bonds down-step portions 268b of heat spreader 268 to insulating layer 148 and conductive layer 150 of interposer 162. Dam materials 250 and 260 and channel 256 contain the compressed conductive adhesive layer 264 within cover attach area 254. Heat spreader 268 and TIM 266 form a thermal conduction path that distributes and dissipates the heat generated by semiconductor die 124 and increases the thermal performance of semiconductor package 270. Conductive adhesive material 264 thermally conducts a portion of the heat from semiconductor die 124 through heat spreader 268 and conductive layers 150 and 160 and conductive vias 146 of interposer 162. An EMI and RFI shielding layer can also be mounted to semiconductor die 124 and interposer 162, as described in FIGS. 5a-5b.

An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 272. In some applications, bumps 272 are reflowed a second time to improve electrical contact to conductive layer 160. Bumps 272 can also be compression bonded to conductive layer 160. Bumps 272 represent one type of interconnect structure that can be formed over conductive layer 160. The interconnect structure can also use bond wires, stud bump, micro bump, or other electrical interconnect.

Figure 9A:
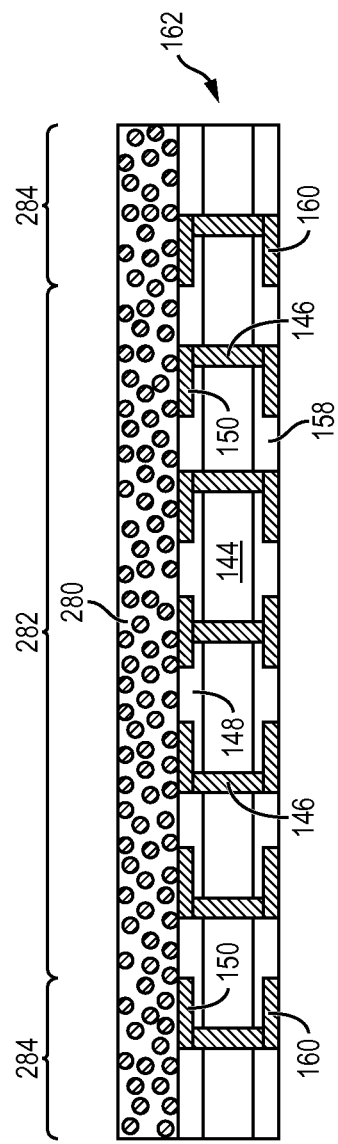

FIGS. 9a-9f illustrate another embodiment of mounting a heat spreader to a semiconductor die and interposer with an ACF material. Continuing from the structure shown in FIG. 4d, an anisotropic conductive film or layer (ACF) 280 is deposited over insulating layer 148 and conductive layer 150 of interposer 162 using lamination, printing, or other suitable application process, as shown in FIG. 9a. Alternatively, anisotropic conductive paste (ACP) or anisotropic conductive adhesive (ACA) can be deposited over interposer 162. ACF 280 can be epoxy or acryl-based material with B-stage properties for reliable dicing. In one embodiment, ACF 280 contains metal particles or matrix of conductive particles, each having a polymer core with Ni plating and Au plating and outer polymer coating. ACF 280 has a thickness greater than a height of bumps 134, e.g., 25-100 micrometers (μm). In its normal state, ACF 280 is non-conductive as the conductive particles are not in contact with adjacent conductive particles. However, under proper conditions of force and temperature, certain portions of ACF 280 can be made conductive as the particles are forced together to form a thermal or electrical conduction path.

A top surface of interposer 162 has a die attach area 282 designated for mounting semiconductor die 124 and cover attach area 284 designed as mounting point for a cover, such as a heat spreader or shielding layer. The die attach area 282 is generally located within an interior space of interposer 162. Cover attach area 284 is located around die attach area 282, outside a footprint of the later-mounted semiconductor die 124, e.g., around a perimeter region of interposer 162.

In FIG. 9b, semiconductor die 124 from FIGS. 3a-3c is aligned to die attach area 282 and mounted to interposer 162 by applying a force F1 to back surface 128 of semiconductor die 124 under high temperature, e.g., 100-300° C. for 10 seconds to 60 minutes, to press the semiconductor die 124 against interposer 162 and embed bumps 134 into ACF 280. The force F1 presses bumps 134 into the matrix of conductive particles and compresses the conductive particles to form a low resistance electrical connection to the bumps. An optional electric field can be applied in line with bumps 134 to reposition the conductive particles inside ACF 280 to be aligned with or concentrated under the bumps or contact pads. The electric field aids in making physical connection between the conductive particles in the compressed ACF 280 in order to form an electrical path to bumps 134. The portion of ACF 280 which is not under bumps 134, e.g., the portion of ACF 280 under active surface 130, remains in its normal state, i.e., non-compressed and non-conductive. The force F1 is removed after the portion of ACF 280 under bumps 134 is compressed. Bumps 134 remain substantially enclosed by ACF 280 after the force F1 is removed. The portion of ACF 280 under bumps 134 provides a low resistance electrical connection between the bumps and conductive layers 150 and 160 and conductive vias 146 of interposer 162. Bumps 134 can be relatively small, e.g., micro-bumps, to realize ultra thin packages without void formation. The small bumps 134 provide a fine interconnect pitch and, in some cases, can be omitted by compressing ACF 280 under contact pads 132. ACF 280 is cured by the elevated temperature to firmly hold semiconductor die 124 to interposer 162.

FIG. 9c shows semiconductor die 124 mounted to interposer 162 with bumps 134 embedded within ACF 280 over die attach area 282. Alternatively, a PoP semiconductor device can be mounted to die attach area 282 of interposer 162. Bumps 134 are electrically connected to conductive layers 150 and 160 and conductive vias 146 in accordance with the electrical design and function of semiconductor die 124. The compressed ACF 280 under bumps 134 forms a low resistance electrical interconnect to conductive layer 150. ACF 280 eliminates the need to form wettable pads. ACF 280 bonds semiconductor die 124 to interposer 162 and reduces die shifting during later manufacturing steps. In addition, ACF 280 acts as a buffer layer to reduce stress induced by a coefficient of thermal expansion (CTE) mismatch between semiconductor die 124 and interposer 162.

Figure 9D:
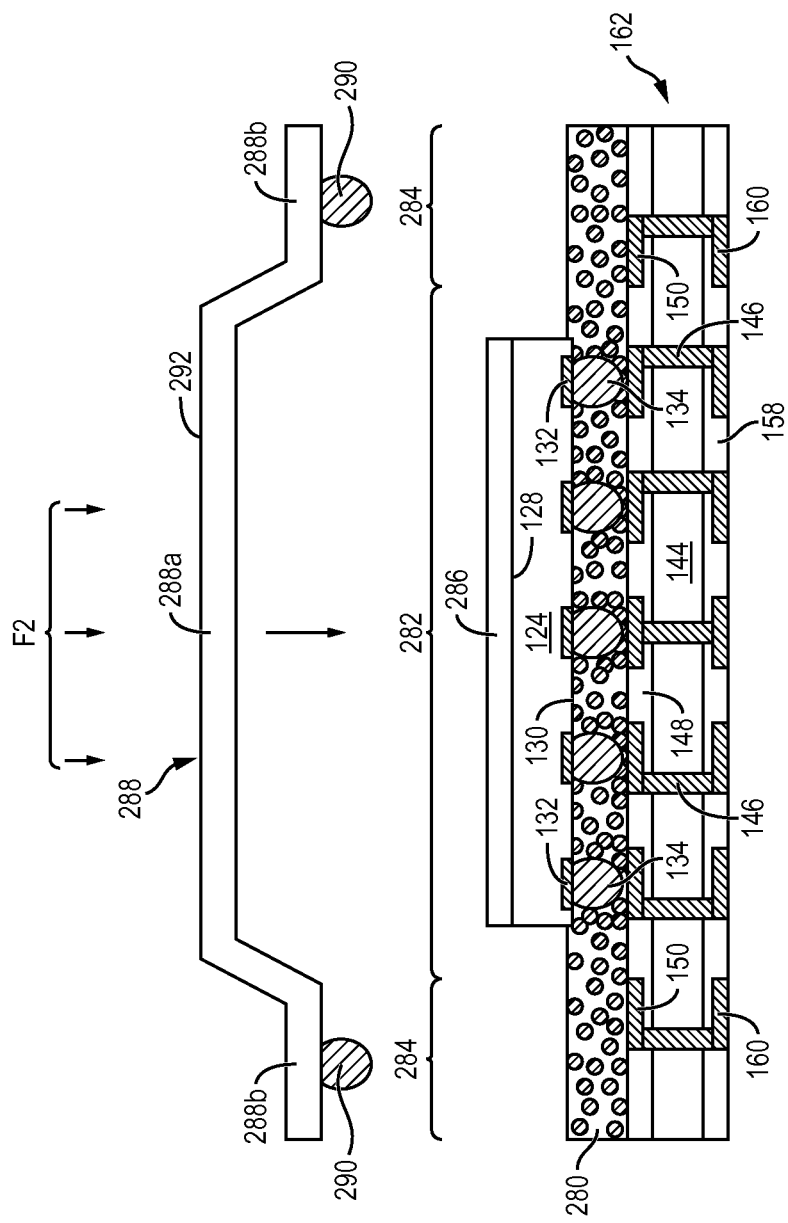

In FIG. 9d, a TIM 286 is deposited over back surface 128 of semiconductor die 124. TIM 286 is a thermal epoxy, thermal epoxy resin, or thermal conductive paste. Bumps 290 are formed under down-step portions 288b of heat spreader 288. Heat spreader or heat sink 288 is positioned over and mounted to cover attach area 284 of interposer 162 and TIM 286 over semiconductor die 124. Heat spreader 288 can be Cu, Al, or other material with high thermal conductivity.

In another embodiment, TIM 286 can be applied to underside of horizontal portion 288a prior to mounting heat spreader 288 to interposer 162. In addition, semiconductor die 124 can be mounted to heat spreader 288 with back surface 128 bonded to TIM 286 on the underside of horizontal portion 288a. The heat spreader and semiconductor die assembly is then mounted to interposer 162.

The down-step portions 288b of heat spreader 288 are aligned to cover attach area 284 and the heat spreader is mounted to interposer 162 by applying a force F2 to back surface 292 of heat spreader 288 under high temperature, e.g., 100-300° C. for 10 seconds to 60 minutes, to embed bumps 290 into ACF 280 under down-step portions 288b. The horizontal portion 288a of heat spreader 288 bonds to TIM 286 on back surface 128 of semiconductor die 124. The force F2 presses bumps 290 into the matrix of conductive particles to form a thermal connection between heat spreader 288 and interposer 162. An optional electric field can be applied in line with conductive layer 150 to reposition the conductive particles inside ACF 280 to be aligned with or concentrated under down-step portions 288b. The electric field aids in making physical connection between the conductive particles in the compressed ACF 280 in order to form a thermal path between down-step portions 288b and conductive layer 150. The portion of ACF 280 which is not under down-step portions 288b remains in its normal state, i.e., non-compressed and non-conductive. The force F2 is removed after the portion of ACF 280 under down-step portions 288b is compressed. The portion of ACF 280 under down-step portions 288b provides a thermal connection between the down-step portions and conductive layers 150 and 160 and conductive vias 146 of interposer 162. ACF 280 is cured by the elevated temperature to firmly hold heat spreader 288 to interposer 162.

Figure 9E:
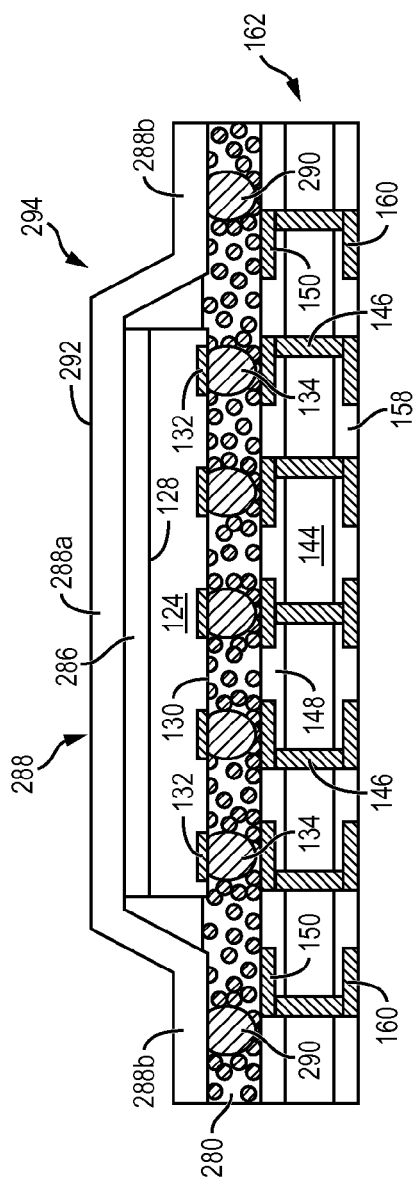

FIG. 9e shows heat spreader 288 mounted to semiconductor die 124 and interposer 162 with bumps 290 embedded within ACF 280 over heat spreader attach area 284. ACF 280 provides for semiconductor die attach, heat spreader attach, and die underfill, all using the same material. ACF 280 makes an electrical connection between bumps 134 of semiconductor die 124 and conductive layers 150 and 160 and conductive vias 146 of interposer 162. Heat spreader 288 and TIM 286 form a thermal conduction path that distributes and dissipates the heat generated by semiconductor die 124 and increases the thermal performance of eWLB semiconductor package 294. ACF 280 thermally conducts a portion of the heat from semiconductor die 124 through heat spreader 288 and conductive layers 150 and 160 and conductive vias 146 of interposer 162. An EMI and RFI shielding layer can also be mounted to semiconductor die 124 and interposer 162, as described in FIGS. 5a-5b.

Figure 9F:
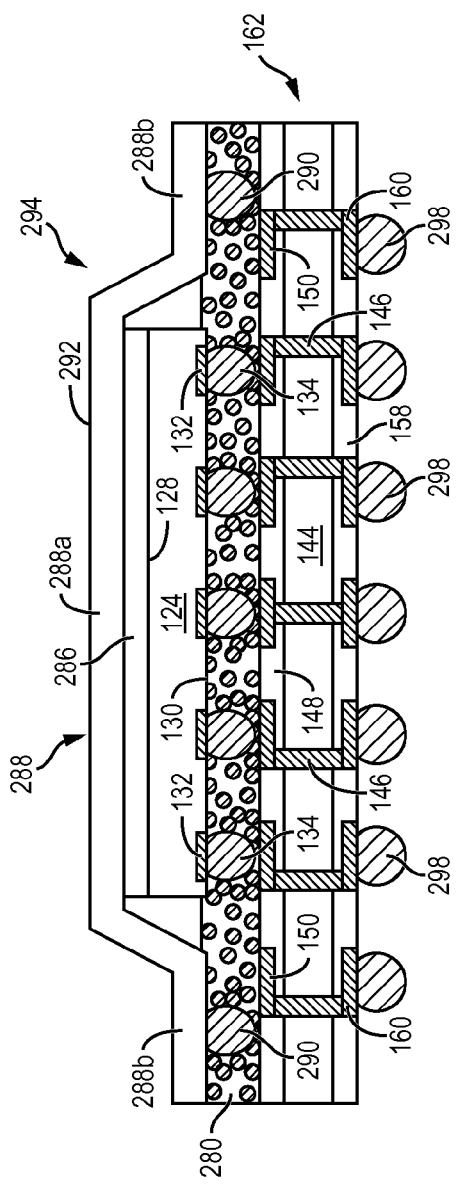

In FIG. 9f, an electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 298. In some applications, bumps 298 are reflowed a second time to improve electrical contact to conductive layer 160. Bumps 298 can also be compression bonded to conductive layer 160. Bumps 298 represent one type of interconnect structure that can be formed over conductive layer 160. The interconnect structure can also use bond wires, stud bump, micro bump, or other electrical interconnect.

FIGS. 10a-10f illustrate another embodiment of mounting a heat spreader to a semiconductor die and interposer with an ACF material. Continuing from the structure shown in FIG. 4d, an ACF 300 is deposited over insulating layer 148 and conductive layer 150 of interposer 162 using lamination, printing, or other suitable application process, as shown in FIG. 10a. Alternatively, ACP or ACA can be deposited over interposer 162. ACF 300 can be epoxy or acryl-based material with B-stage properties for reliable dicing. In one embodiment, ACF 300 contains metal particles or matrix of conductive particles, each having a polymer core with Ni plating and Au plating and outer polymer coating. ACF 300 has a thickness of 25-100 μm. In its normal state, ACF 300 is non-conductive as the conductive particles are not in contact with adjacent conductive particles. However, under proper conditions of force and temperature, certain portions of ACF 300 can be made conductive as the particles are forced together to form a thermal or electrical conduction path.

A top surface of interposer 162 has a die attach area 302 designated for mounting semiconductor die 124 and cover attach area 304 designed as mounting point for a heat spreader. The die attach area 302 is generally located within an interior space of interposer 162. Cover attach area 304 is located around die attach area 302, outside a footprint of the later-mounted semiconductor die 124, e.g., around a perimeter region of interposer 162.

In FIG. 10b, semiconductor die 124 from FIGS. 3a-3c, without bumps 134, is aligned to die attach area 282 and mounted to interposer 162 by applying a force F1 to back surface 128 of semiconductor die 124 under high temperature, e.g., 100-300° C. for 10 seconds to 60 minutes, to press contact pads 132 into ACF 300. The force F1 compresses the conductive particles to form a low resistance electrical connection to contact pads 132. An optional electric field can be applied in line with contact pads 132 to reposition the conductive particles inside ACF 300 to be aligned with or concentrated under the contact pads. The electric field aids in making physical connection between the conductive particles in the compressed ACF 300 in order to form an electrical path to contact pads 132. The portion of ACF 300 which is not under contact pads 132 remains in its normal state, i.e., non-compressed and non-conductive. The force F1 is removed after the portion of ACF 300 under contact pads 132 is compressed. The portion of ACF 300 under contact pads 132 provides a low resistance electrical connection between the contact pads and conductive layers 150 and 160 and conductive vias 146 of interposer 162. ACF 300 is cured by the elevated temperature to firmly hold semiconductor die 124 to interposer 162.

FIG. 10c shows semiconductor die 124 mounted to interposer 162 with contact pads 132 embedded within ACF 300 over die attach area 302. Alternatively, a PoP semiconductor device can be mounted to die attach area 302 of interposer 162. Contact pads 132 are electrically connected to conductive layers 150 and 160 and conductive vias 146 in accordance with the electrical design and function of semiconductor die 124. The compressed ACF 300 under contact pads 132 forms a low resistance electrical interconnect to conductive layer 150. ACF 300 eliminates the need to form wettable pads. ACF 300 bonds semiconductor die 124 to interposer 162 and reduces die shifting during later manufacturing steps. In addition, ACF 300 acts as a buffer layer to reduce stress induced by a CTE mismatch between semiconductor die 124 and interposer 162.

In FIG. 10d, a TIM 306 is deposited over back surface 128 of semiconductor die 124. TIM 306 is a thermal epoxy, thermal epoxy resin, or thermal conductive paste. Heat spreader or heat sink 308 is positioned over and mounted to cover attach area 304 of interposer 162 and TIM 306 over semiconductor die 124. Heat spreader 308 can be Cu, Al, or other material with high thermal conductivity.

In another embodiment, TIM 306 can be applied to underside of horizontal portion 308a prior to mounting heat spreader 308 to interposer 162. In addition, semiconductor die 124 can be mounted to heat spreader 308 with back surface 128 bonded to TIM 306 on the underside of horizontal portion 308a. The heat spreader and semiconductor die assembly is then mounted to interposer 162.

The down-step portions 308b of heat spreader 308 are aligned to cover attach area 304 and the heat spreader is mounted to interposer 162 by applying a force F2 to back surface 310 of heat spreader 308 under high temperature, e.g., 100-300° C. for 10 seconds to 60 minutes, to compress a portion of ACF 300 under down-step portions 308b. The horizontal portion 308a of heat spreader 308 bonds to TIM 306 on back surface 128 of semiconductor die 124. The force F2 compresses the matrix of conductive particles under down-step portions 308b to form a thermal connection to heat spreader 308. An optional electric field can be applied in line with conductive layer 150 308b to reposition the conductive particles inside ACF 300 to be aligned with or concentrated under down-step portions 308b. The electric field aids in making physical connection between the conductive particles in the compressed ACF 300 in order to form a thermal path between down-step portions 308b and conductive layer 150. The portion of ACF 300 which is not under down-step portions 308b remains in its normal state, i.e., non-compressed and non-conductive. The force F2 is removed after the portion of ACF 300 under down-step portions 308b is compressed. The portion of ACF 300 under down-step portions 308b provides a thermal connection between the down-step portions and conductive layers 150 and 160 and conductive vias 146 of interposer 162. ACF 300 is cured by the elevated temperature to firmly hold heat spreader 308 to interposer 162.

FIG. 10e shows heat spreader 308 mounted to semiconductor die 124 and interposer 162 with down-step portions 308b embedded within ACF 300 over heat spreader attach area 304. ACF 300 provides for semiconductor die attach, heat spreader attach, and die underfill, all using the same material. ACF 300 makes a thermal or electrical connection between contact pads 132 of semiconductor die 124 and conductive layers 150 and 160 and conductive vias 146 of interposer 162. Heat spreader 308 and TIM 306 form a thermal conduction path that distributes and dissipates the heat generated by semiconductor die 124 and increases the thermal performance of semiconductor package 312. ACF 300 thermally conducts a portion of the heat from semiconductor die 124 through heat spreader 308 and conductive layers 150 and 160 and conductive vias 146 of interposer 162. An EMI and RFI shielding layer can also be mounted to semiconductor die 124 and interposer 162, as described in FIGS. 5a-5b.

In FIG. 10f, an electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 314. In some applications, bumps 314 are reflowed a second time to improve electrical contact to conductive layer 160. Bumps 314 can also be compression bonded to conductive layer 160. Bumps 314 represent one type of interconnect structure that can be formed over conductive layer 160. The interconnect structure can also use bond wires, stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    disposing a semiconductor die over a surface of the substrate;
    forming a containment structure on the surface of the substrate and extending from the surface of the substrate to a height less than a height of the semiconductor die;
    providing a cover;
    depositing a conductive adhesive material on the surface of the substrate between the semiconductor die and containment structure; and
    disposing the cover over the semiconductor die and substrate and in contact with the conductive adhesive material and containment structure, wherein the containment structure blocks outward flow of the conductive adhesive material.

2. The method of claim 1, further including disposing the semiconductor die and cover over the substrate simultaneously.

3. The method of claim 1, wherein forming the containment structure further includes forming one or more channels in the surface of the substrate.

4. The method of claim 1, wherein forming the containment structure includes forming one or more dam materials over the surface of the substrate.

5. The method of claim 1, wherein the cover includes a heat spreader or shielding layer.

6. The method of claim 1, further including a thermal interface material disposed between the semiconductor die and cover.

7. The method of claim 1, wherein the cover includes a first horizontal component over the semiconductor die, down-step vertical component extending from the first horizontal component, and second horizontal component extending from the down-step vertical component and contacting the conductive adhesive material and containment structure.

8. A method of making a semiconductor device, comprising:
    providing a substrate;
    disposing a semiconductor die over a surface of the substrate;
    forming a containment structure on the surface of the substrate below a surface of the semiconductor die opposite the substrate;
    providing a cover;
    depositing an adhesive material over the cover or substrate; and
    disposing the cover over the semiconductor die and substrate and in contact with the containment structure, wherein the containment structure blocks outward flow of the adhesive material.

9. The method of claim 8, further including disposing a thermal interface material between the semiconductor die and cover.

10. The method of claim 8, wherein forming the containment structure further includes forming one or more channels in the substrate.

11. The method of claim 8, wherein forming the containment structure includes forming one or more dam materials over the substrate.

12. The method of claim 8, wherein the cover includes a heat spreader or shielding layer.

13. The method of claim 8, wherein the adhesive material includes a conductive adhesive material.

14. The method of claim 8, wherein forming the containment structure includes forming two dam materials of different heights over the surface of the substrate.

15. The method of claim 8, wherein the cover includes a first horizontal component over the semiconductor die, down-step vertical component extending from the first horizontal component, and second horizontal component extending from the down-step vertical component and contacting the containment structure.

16. A semiconductor device, comprising:
    a substrate;
    a semiconductor die disposed over a surface of the substrate;
    a containment structure formed on the surface of the substrate, wherein the containment structure is disposed below a surface of the semiconductor die opposite the substrate;
    a cover disposed over the semiconductor die and substrate and contacting the containment structure; and
    an adhesive material bonding the cover to the substrate with the containment structure disposed outside the adhesive material.

17. The semiconductor device of claim 16, wherein the containment structure further includes one or more channels formed in the substrate.

18. The semiconductor device of claim 16, wherein the adhesive material includes a conductive material.

19. The semiconductor device of claim 16, wherein the containment structure includes one or more dam materials formed over the substrate.

20. The semiconductor device of claim 16, wherein the cover includes a heat spreader or shielding layer.

21. The semiconductor device of claim 16, further including a thermal interface material disposed between the semiconductor die and cover.

22. The semiconductor device of claim 16, wherein the containment structure includes two dam materials of different heights formed over the surface of the substrate.

23. The semiconductor device of claim 16, wherein the cover includes a first horizontal component over the semiconductor die, down-step vertical component extending from the first horizontal component, and second horizontal component extending from the down-step vertical component and contacting the containment structure.

24. A method of making a semiconductor device, comprising:
    providing a substrate;
    forming an anisotropic conductive layer over the substrate;
    disposing a semiconductor die over the substrate by pressing the semiconductor die into the anisotropic conductive layer to electrically connect to the substrate through the anisotropic conductive layer; and
    disposing a cover over the semiconductor die, the cover including a down-step pressed into the anisotropic conductive layer to contact the substrate through the anisotropic conductive layer.

25. The method of claim 24, wherein the anisotropic conductive layer includes an anisotropic conductive film, anisotropic conductive paste, or anisotropic conductive adhesive.

26. The method of claim 24, wherein compressing the semiconductor die into the anisotropic conductive layer forms an electrical connection between the semiconductor die and substrate.

27. The method of claim 24, further including disposing the semiconductor die and cover over the substrate simultaneously.

28. The method of claim 24, wherein the cover includes a heat spreader or shielding layer.

29. The method of claim 24, further including disposing a thermal interface layer between the cover and semiconductor die.

30. The method of claim 24, wherein the cover includes a first horizontal component over the semiconductor die, down-step vertical component extending from the first horizontal component, and second horizontal component extending from the down-step vertical component and pressed into the anisotropic conductive layer to contact the substrate through the anisotropic conductive layer.

* * * * *